US012191345B2

United States Patent
Sobue et al.

(10) Patent No.: US 12,191,345 B2
(45) Date of Patent: Jan. 7, 2025

(54) SEMICONDUCTOR DEVICE

(71) Applicant: Socionext Inc., Kanagawa (JP)

(72) Inventors: Isaya Sobue, Yokohama (JP); Hideyuki Komuro, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 18/598,870

(22) Filed: Mar. 7, 2024

(65) Prior Publication Data

US 2024/0213300 A1 Jun. 27, 2024

Related U.S. Application Data

(60) Division of application No. 17/546,463, filed on Dec. 9, 2021, now Pat. No. 11,955,508, which is a
(Continued)

(51) Int. Cl.
*H01L 21/00* (2006.01)
*H01L 27/06* (2006.01)
(Continued)

(52) U.S. Cl.
CPC .......... *H01L 28/20* (2013.01); *H01L 27/0629* (2013.01); *H01L 23/5286* (2013.01); *H01L 27/092* (2013.01); *H01L 27/0924* (2013.01)

(58) Field of Classification Search
CPC .. H01L 28/20; H01L 27/0629; H01L 23/5286
See application file for complete search history.

(56) References Cited

U.S. PATENT DOCUMENTS 8,344,454 B2 * 1/2013 Nitta ................. H01L 29/78612
438/149
9,129,829 B2 9/2015 Kuhn et al.
(Continued)

FOREIGN PATENT DOCUMENTS

CN 110875304 A * 3/2020 ........... H01L 21/784
EP 2894664 A2 * 7/2015 ....... H01L 21/26586
(Continued)

OTHER PUBLICATIONS

Ryckaert et al., "The Complementary FET (CFET) for CMOS scaling beyond N3," 2018 Symposium on VLSI Technology Digest of Technical Papers, p. 141-p. 142.
(Continued)

*Primary Examiner* — Laura M Menz
(74) *Attorney, Agent, or Firm* — Rimon P.C.

(57) ABSTRACT

A semiconductor device includes a substrate; a first semiconductor region formed over the substrate; a second semiconductor region formed over the substrate, and electrically connected to the first semiconductor region; a third semiconductor region formed over the substrate, and positioned between the first semiconductor region and the second semiconductor region; a fourth semiconductor region formed over the first semiconductor region; a fifth semiconductor region formed over the second semiconductor region, and electrically connected to the fourth semiconductor region; a sixth semiconductor region formed over the third semiconductor region, and positioned between the fourth semiconductor region and the fifth semiconductor region; and wires formed between the first semiconductor region and the second semiconductor region, and between the fourth semiconductor region and the fifth semiconductor region, to cover the third semiconductor region and the sixth semiconductor region, the wires including conductors.

14 Claims, 26 Drawing Sheets

Related U.S. Application Data continuation of application No. PCT/JP2019/024107, filed on Jun. 18, 2019.

(51) Int. Cl.
  *H01L 49/02* (2006.01)
  *H01L 23/528* (2006.01)
  *H01L 27/092* (2006.01)

(56) References Cited

U.S. PATENT DOCUMENTS

| | | | |
|---|---|---|---|
| 9,406,787 B2* | 8/2016 | Ikegami | H01L 21/30604 |
| 9,570,395 B1 | 2/2017 | Sengupta et al. | |
| 9,837,414 B1 | 12/2017 | Balakrishnan et al. | |
| 10,153,273 B1* | 12/2018 | Tsai | H01L 21/746 |
| 10,854,710 B2* | 12/2020 | Tanaka | H01L 27/0886 |
| 10,971,581 B2* | 4/2021 | Tanaka | H01L 27/0886 |
| 11,063,035 B2* | 7/2021 | Ito | H01L 29/775 |
| 11,233,045 B2* | 1/2022 | Cheng | H01L 27/0255 |
| 11,955,508 B2* | 4/2024 | Sobue | H01L 27/0629 |
| 12,046,594 B1* | 7/2024 | Zhang | H01L 29/872 |
| 2005/0082639 A1* | 4/2005 | Kikuta | H01L 27/0629 |
| | | | 257/532 |
| 2006/0049429 A1* | 3/2006 | Kim | H01L 29/78654 |
| | | | 257/E21.415 |
| 2014/0127860 A1* | 5/2014 | Muto | H01L 21/6836 |
| | | | 438/109 |
| 2014/0175515 A1* | 6/2014 | Then | H01L 21/0251 |
| | | | 438/168 |
| 2016/0172360 A1 | 6/2016 | Shimbo | |
| 2017/0040321 A1 | 2/2017 | Mitard | |
| 2018/0047832 A1 | 2/2018 | Tapily et al. | |
| 2018/0337231 A1* | 11/2018 | Tanaka | H01L 27/0266 |
| 2018/0342575 A1* | 11/2018 | Tanaka | H01L 29/785 |
| 2018/0366589 A1 | 12/2018 | Shimbo | |
| 2019/0074297 A1* | 3/2019 | Kishishita | H01L 29/78654 |
| 2019/0393302 A1* | 12/2019 | Tanaka | H01L 27/0292 |
| 2020/0044017 A1* | 2/2020 | Tanaka | H01L 29/785 |
| 2020/0203334 A1* | 6/2020 | Ito | H01L 27/092 |
| 2021/0028304 A1* | 1/2021 | Jeong | H01L 27/0924 |
| 2021/0184035 A1* | 6/2021 | Tanaka | H01L 23/5223 |
| 2021/0313312 A1* | 10/2021 | Cheng | H01L 27/0262 |
| 2021/0358903 A1* | 11/2021 | Cheng | H01L 29/0611 |
| 2021/0358923 A1* | 11/2021 | Yang | H01L 29/42392 |
| 2021/0375863 A1* | 12/2021 | Komuro | H01L 27/11807 |
| 2022/0045056 A1* | 2/2022 | Wang | H01L 27/092 |
| 2022/0045215 A1* | 2/2022 | Takeno | H01L 29/7855 |
| 2022/0077138 A1* | 3/2022 | Okubo | H01L 21/822 |
| 2022/0077141 A1* | 3/2022 | Okubo | H01L 27/0292 |
| 2022/0102479 A1* | 3/2022 | Sobue | H01L 27/0629 |
| 2023/0047840 A1* | 2/2023 | Lee | H03B 5/1228 |
| 2023/0053433 A1* | 2/2023 | Serizawa | H01L 29/0673 |
| 2023/0095421 A1* | 3/2023 | Hong | H01L 23/5228 |
| | | | 257/379 |
| 2024/0006490 A1* | 1/2024 | Pidin | H01L 29/42392 |
| 2024/0213300 A1* | 6/2024 | Sobue | H01L 27/0688 |

FOREIGN PATENT DOCUMENTS

| | | | | |
|---|---|---|---|---|
| EP | 4135034 A1 * | 2/2023 | | H01L 21/8221 |
| JP | S63-275158 A | 11/1988 | | |
| JP | 2006-080519 A | 3/2006 | | |
| JP | 2018-026565 A | 2/2018 | | |
| JP | 2018-064125 A | 4/2018 | | |
| JP | 2018200916 A * | 12/2018 | | H01L 27/0266 |
| WO | 2017/145906 A1 | 8/2017 | | |
| WO | 2017/191799 A1 | 11/2017 | | |
| WO | WO-2020043218 A1 * | 3/2020 | | H01L 27/0255 |
| WO | WO-2020093935 A1 * | 5/2020 | | H01L 21/266 |
| WO | WO-2020217400 A1 * | 10/2020 | | H01L 29/1041 |
| WO | WO-2020235082 A1 * | 11/2020 | | H01L 23/485 |
| WO | WO-2020235084 A1 * | 11/2020 | | H01L 27/0255 |
| WO | WO-2020255256 A1 * | 12/2020 | | H01L 27/0629 |
| WO | WO-2021229740 A1 * | 11/2021 | | H01L 21/8221 |

OTHER PUBLICATIONS

A. Mocuta et al., "Enabling CMOS Scaling Towards 3nm and Beyond" 2018 Symposium on VLSI Technology Digest of Technical Papers pp. 147-148.

International Search Report and Written Opinion issued in International Patent Application No. PCT/JP2019/024107 dated Jul. 23, 2019; with partial English translation.

Notice of Reasons for Refusal dated Mar. 7, 2023 issued in the corresponding Japanese Patent Application No. 2021-528500, with English translation.

Notice of Allowance dated Jan. 12, 2024 issued in U.S. Appl. No. 17/546,463.

\* cited by examiner

SEMICONDUCTOR DEVICE

CROSS-REFERENCE TO RELATED APPLICATIONS

This application is a Divisional of U.S. patent application Ser. No. 17/546,463, filed on Dec. 9, 2021, which is a Continuation of International Patent Application No. PCT/JP2019/024107, filed on Jun. 18, 2019, and designated the U.S., the entire contents of which are incorporated herein by reference.

FIELD

The present disclosure relates to a semiconductor device.

BACKGROUND

There are semiconductor devices that use the gate electrode of a field effect transistor as a resistor element.

In recent years, devices called complementary field effect transistors (CFETs) have been known. In a CFET, an n-channel FET and a p-channel FET are stacked over a substrate. The CFET is suitable for finer microfabrication of semiconductor devices.

RELATED ART DOCUMENTS

Patent Documents

[Patent Document 1] U.S. Pat. No. 9,570,395
[Patent Document 2] U.S. Pat. No. 9,837,414
[Patent Document 3] U.S. Patent Application Publication No. 2017/0040321
[Patent Document 4] U.S. Pat. No. 9,129,829
[Patent Document 5] Japanese Laid-Open Patent Application No. 2018-26565
[Patent Document 6] Japanese Laid-Open Patent Application No. S63-275158

Non-Patent Documents

[Non-Patent Document 1] 2018 Symposium on VLSI Technology Digest of Technical Papers, P141-P142
[Non-Patent Document 2] 2018 Symposium on VLSI Technology Digest of Technical Papers, P147-P148

Up to the present, no detailed investigation has been conducted with respect to a specific configuration in the case of using a CFET for a resistor element.

SUMMARY

According to the disclosed techniques, a semiconductor device includes a substrate; a first semiconductor region formed over the substrate; a second semiconductor region formed over the substrate, and electrically connected to the first semiconductor region; a third semiconductor region formed over the substrate, and positioned between the first semiconductor region and the second semiconductor region; a fourth semiconductor region formed over the first semiconductor region; a fifth semiconductor region formed over the second semiconductor region, and electrically connected to the fourth semiconductor region; a sixth semiconductor region formed over the third semiconductor region, and positioned between the fourth semiconductor region and the fifth semiconductor region; and wires formed between the first semiconductor region and the second semiconductor region, and between the fourth semiconductor region and the fifth semiconductor region, to cover the third semiconductor region and the sixth semiconductor region, the wires including conductors.

The object and advantages in the present embodiments will be realized and attained by means of the elements and combinations particularly pointed out in the claims. It is to be understood that both the foregoing general description and the following detailed description are exemplary and explanatory and are not restrictive of the invention as claimed.

DESCRIPTION OF EMBODIMENTS

Figure 1:
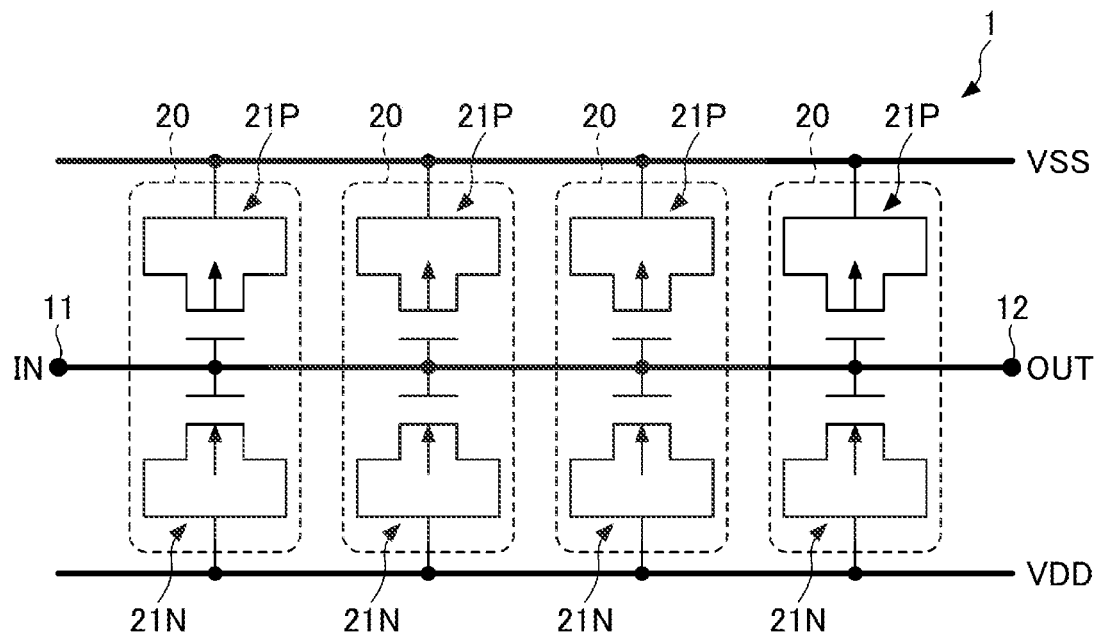
FIG. 1 is a circuit diagram illustrating a configuration of a semiconductor device according to a first embodiment.

In the following, embodiments will be described in detail with reference to the accompanying drawings. According to the disclosed techniques, a resistor element including a structure such as a CFET can be implemented. Note that in the present specification and drawings, components having substantially the same functional configurations may be assigned the same reference numerals, to omit duplicated description. Also, in the following description, two directions orthogonal to each other and parallel to a surface of a substrate are defined as the X direction and the Y direction, and a direction perpendicular to the surface of the substrate is defined as the Z direction.

First Embodiment

Figure 2:
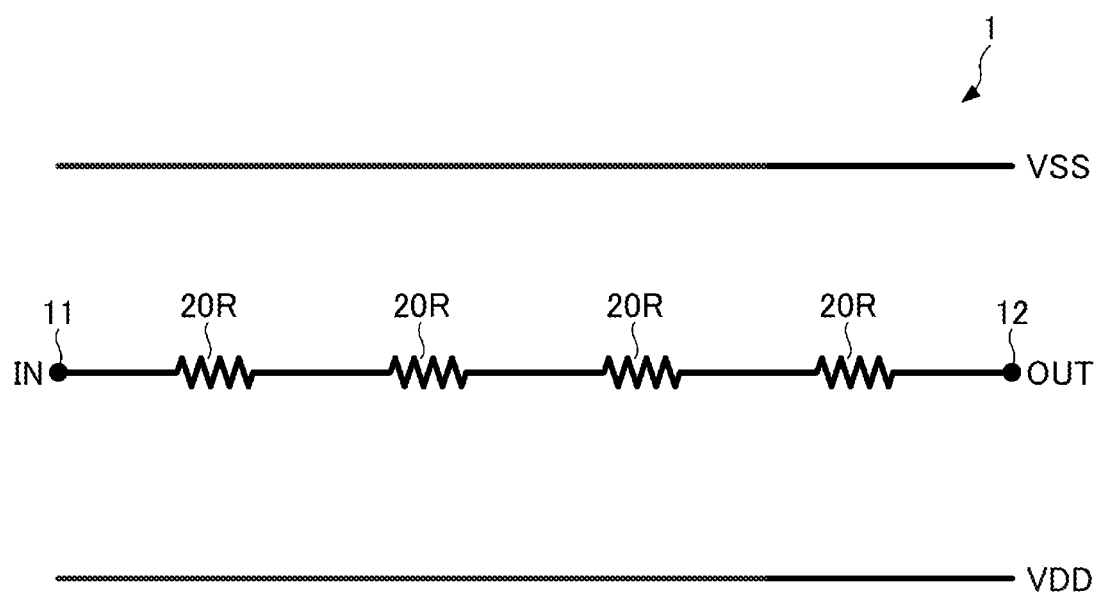
FIG. 2 is an equivalent circuit diagram of the circuit diagram illustrated in FIG. 1.

First, a first embodiment will be described. FIG. 1 is a circuit diagram illustrating a configuration of a semiconductor device according to the first embodiment. FIG. 2 is an equivalent circuit diagram of the circuit diagram illustrated in FIG. 1.

As illustrated in FIG. 1, a semiconductor device 1 according to the first embodiment includes an input terminal 11 to receive an input signal IN as input, an output terminal 12 to output an output signal OUT, and multiple pseudo CFETs 20 between the input terminal 11 and the output terminal 12. Here, four pseudo CFETs 20 are provided.

Each pseudo CFET 20 includes a pseudo N-channel MOS transistor 21N and a pseudo P-channel MOS transistor 21P. As will be described in detail later, the pseudo P-channel MOS transistor 21P is formed over the pseudo N-channel MOS transistor 21N. The pseudo N-channel MOS transistor 21N has substantially the same configuration as an N-channel MOS transistor. In the pseudo N-channel MOS transistor 21N, a portion corresponding to the source and a portion corresponding to the drain of an N-channel MOS transistor are both connected to a VDD wire to which a power supply potential of VDD is supplied. The pseudo P-channel MOS transistor 21P has substantially the same configuration as a P-channel MOS transistor. In the pseudo P-channel MOS transistor 21P, a portion corresponding to the source and a portion corresponding to the drain of a P-channel MOS transistor are both connected to a VSS wire to which a power supply potential of VSS is supplied. The power supply potential of VSS is, for example, a ground potential. The VSS wire may also be referred to as the grounding wire, and the VDD wire may also be referred to as the power supply wire.

As illustrated in FIG. 2, each pseudo CFET 20 functions as a resistor 20R. The resistors 20R are connected in series between the input terminal 11 and the output terminal 12. In other words, the semiconductor device 1 has resistor elements including the four resistors 20R.

Figure 3:
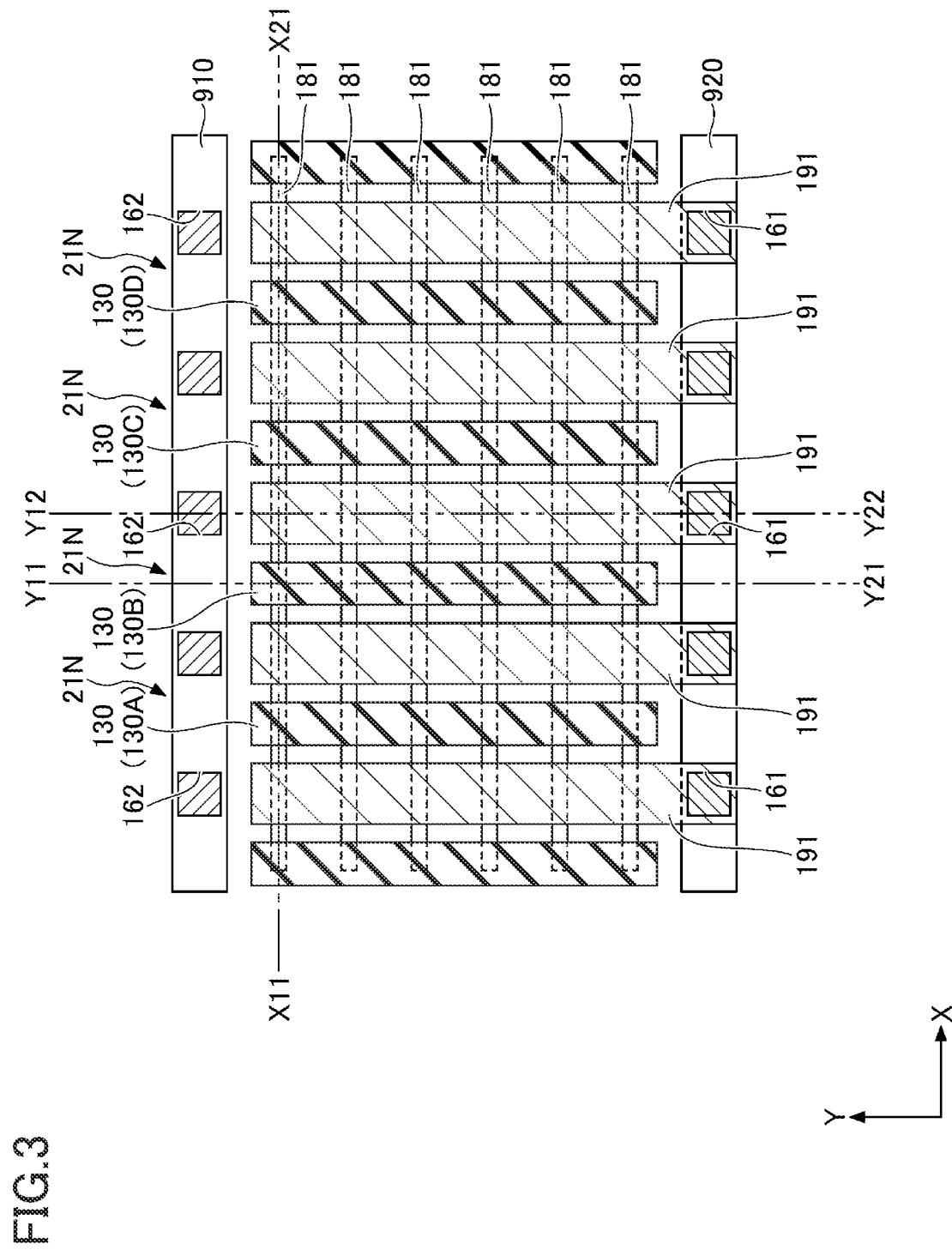
FIG. 3 is a schematic diagram (part 1) illustrating a planar configuration of pseudo CFETs in the first embodiment.
Figure 4:
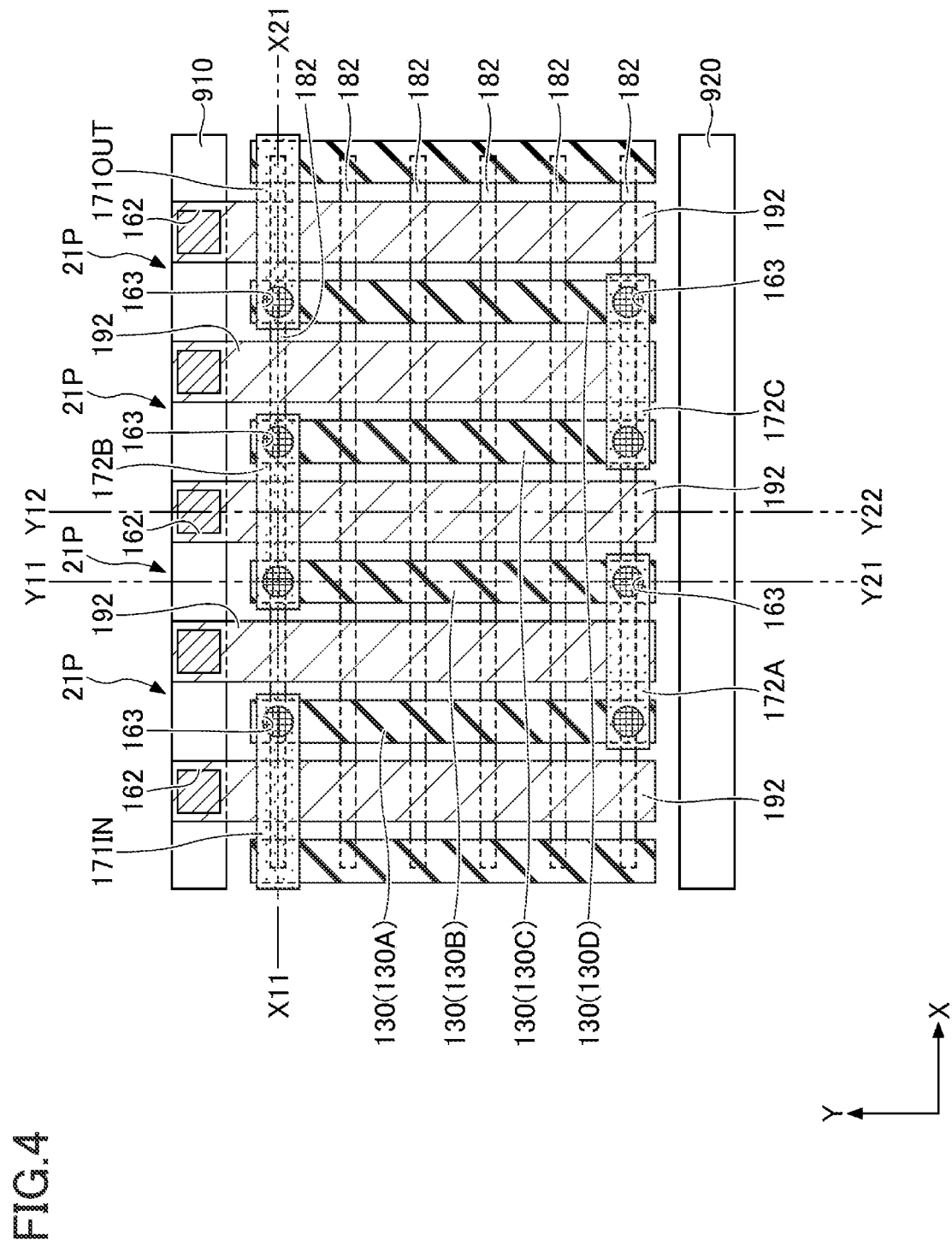
FIG. 4 is a schematic diagram (part 2) illustrating a planar configuration of the pseudo CFETs in the first embodiment.
Figure 5:
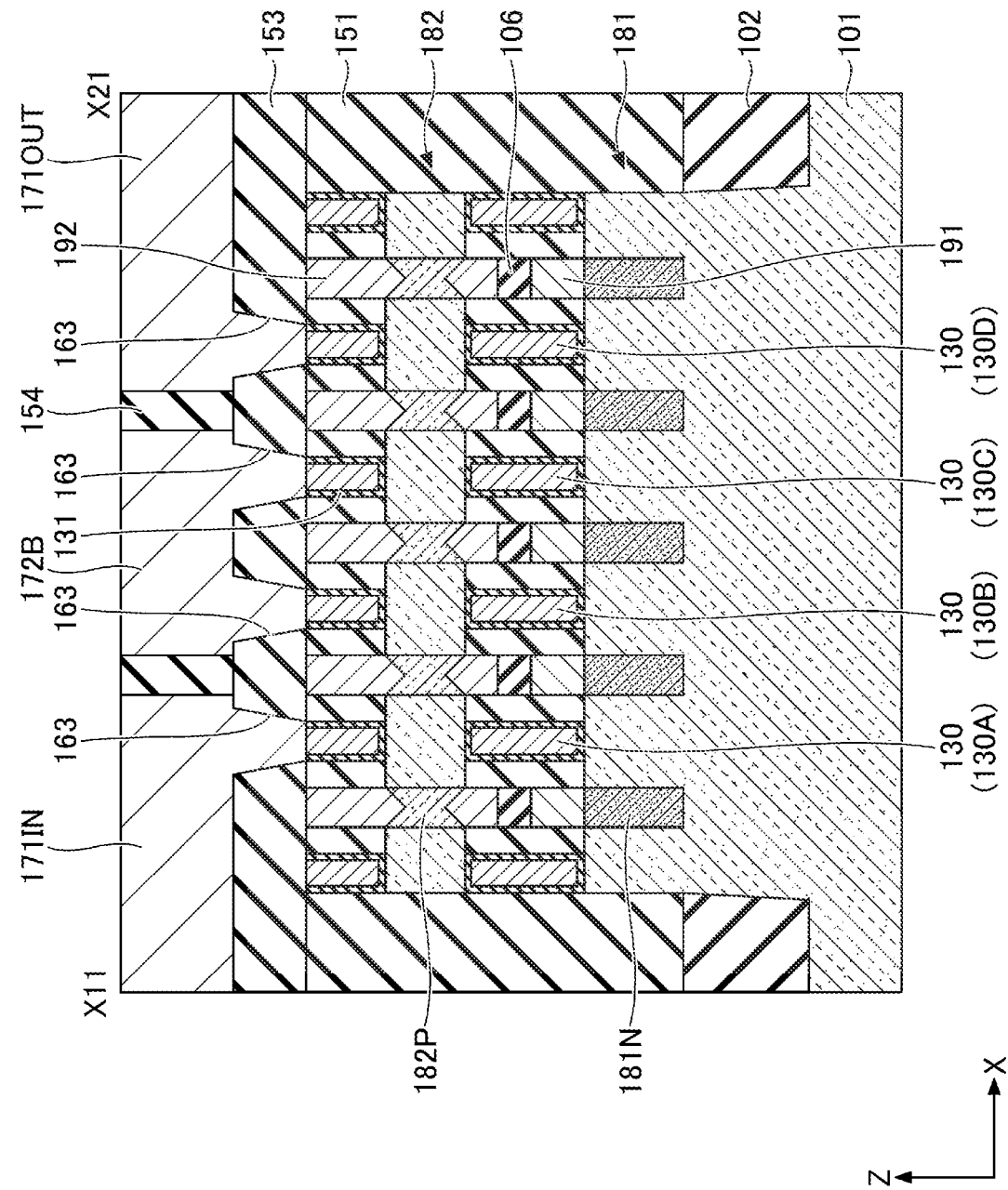
FIG. 5 is a cross sectional view (part 1) illustrating the pseudo CFETs in the first embodiment.
Figure 6:
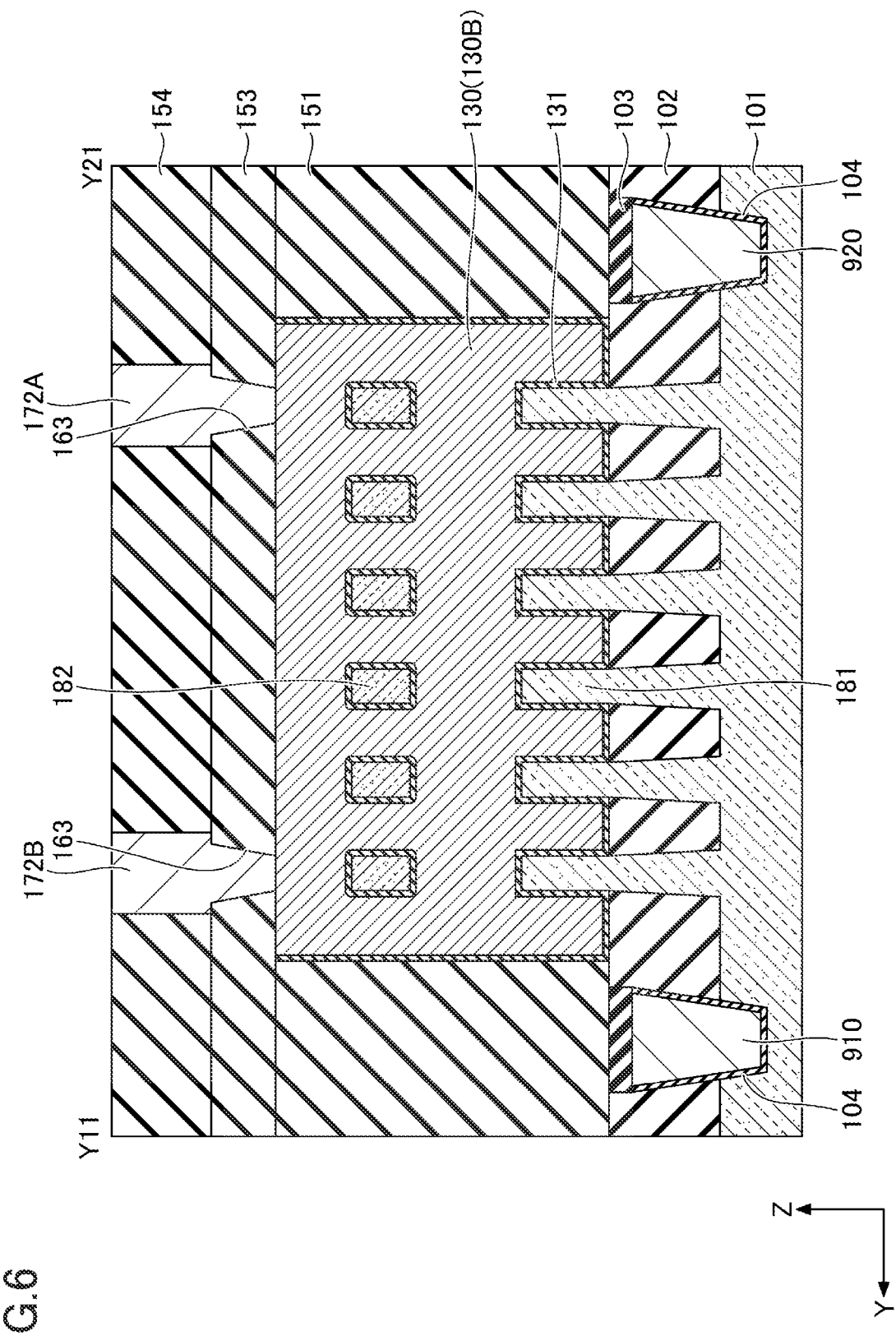
FIG. 6 is a cross sectional view (part 2) illustrating the pseudo CFET in the first embodiment.
Figure 7:
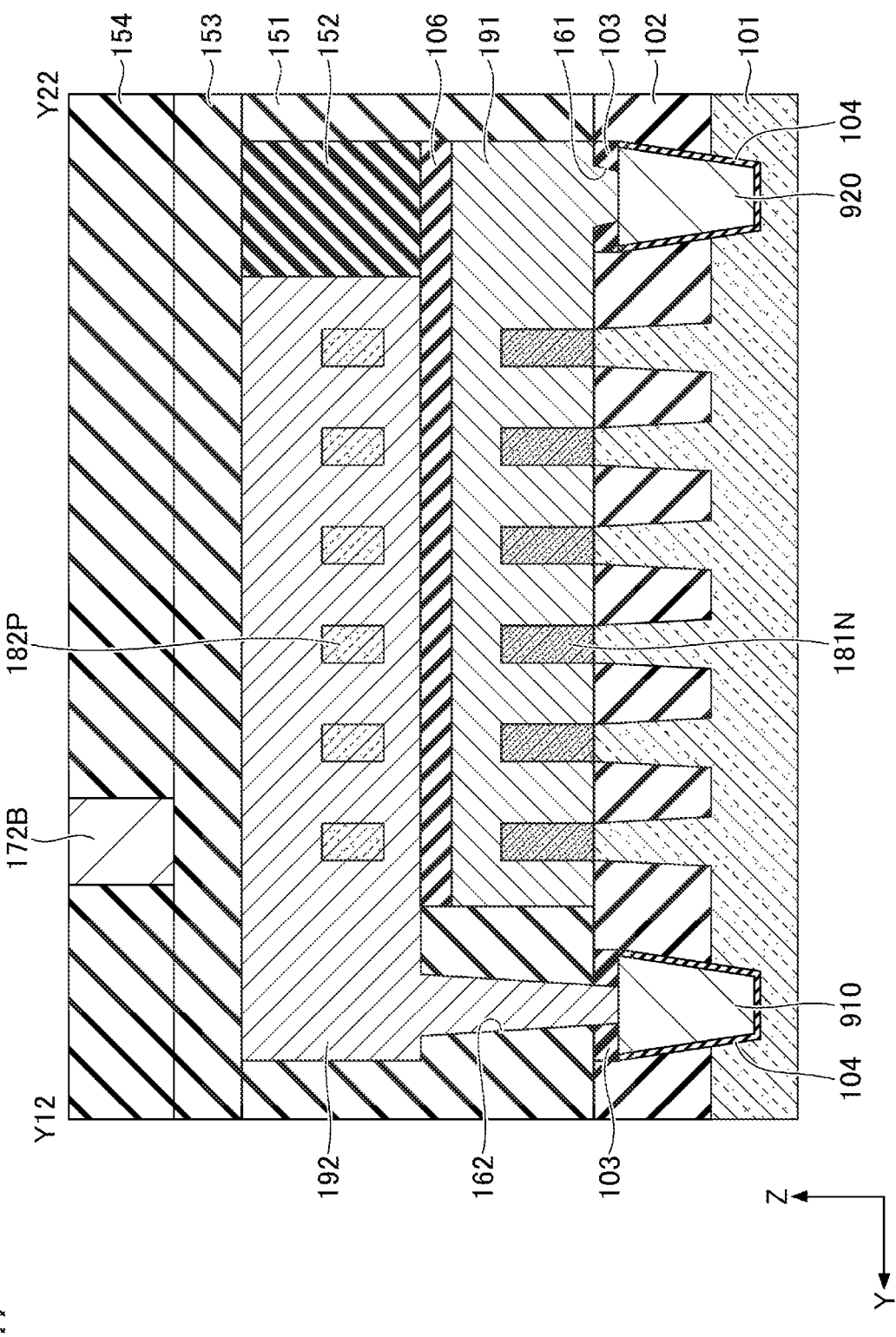
FIG. 7 is a cross sectional view (part 3) illustrating the pseudo CFET in the first embodiment.

Next, a configuration of the pseudo CFETs 20 in the first embodiment will be described. FIGS. 3 and 4 are schematic diagrams illustrating a planar configuration of the pseudo CFETs 20 in the first embodiment. FIG. 3 mainly illustrates a layout of the pseudo N-channel MOS transistors 21N. FIG. 4 mainly illustrates a layout of the pseudo P-channel MOS transistors 21P. Except for structures illustrated in both FIGS. 3 and 4, the structures illustrated in FIG. 4 are positioned above the structures illustrated in FIG. 3. FIGS. 5, 6, and 7 are cross sectional views illustrating the pseudo CFETs 20 in the first embodiment. FIG. 5 corresponds to a cross sectional view along a line X11-X21 in FIGS. 3 and 4. FIG. 6 corresponds to a cross sectional view along a line Y11-Y21 in FIGS. 3 and 4. FIG. 7 corresponds to a cross sectional view along a line Y12-Y22 in FIGS. 3 and 4.

As illustrated in FIGS. 5 to 7, an element separating film 102 is formed over a surface of the substrate 101. The element separating film 102 is formed by, for example, an STI (Shallow Trench Isolation) process. Multiple trenches extending in the X direction are formed in the substrate 101 and the element separating film 102, and power lines 910 and 920 are formed in these trenches via insulating films 104. For example, the surface of each of the power lines 910 and 920 are covered with an insulating film 103. For example, the surface of the element separating film 102 and the surface of the insulating film 103 may be flush with or may not be flush the surface of the substrate 101. The power lines 910 and 920 having such a structure may also be referred to as BPR (Buried Power Rails). For example, the power line 910 corresponds to the VSS wire, and the power line 920 corresponds to the VDD wire.

As illustrated in FIGS. 3 and 5, multiple fins 181 extending in the X direction and rising in the Z direction, are formed to be arranged side by side in the Y direction as semiconductor regions between the power line 910 and the power line 920, over the substrate 101 exposed from the element separating film 102. Here, six fins 181 are provided. Each fin 181 includes multiple N-type regions 181N arranged side by side in the X direction. Here, the fin 181 includes five N-type regions 181N. Across the fins 181, the N-type regions 181N are arranged side by side in the Y direction. The N-type region 181N serves as the source or drain of the pseudo N-channel MOS transistor 21N.

As illustrated in FIGS. 3 and 7, multiple local wires 191 arranged in the Y direction and connected to the N-type regions 181N are formed over the element separating film 102. The local wires 191 extend in the Y direction. Here, five local wires 191 are formed. The local wires 191 extend above the power line 920.

As illustrated in FIG. 7, contact holes 161 are formed in the insulating film 103 between the local wires 191 and the power line 920. Each local wire 191 is connected to the power line 920 via the conductor in a corresponding contact hole 161. Each local wire 191 electrically connects the power line 920 to corresponding N-type regions 181N. Over the local wire 191, an insulating film 106 is formed.

As illustrated in FIGS. 5 and 7, via the insulating films 106, local wires 192 are formed over the local wires 191. The local wires 191 and the local wires 192 are separated by the insulating films 106, to be electrically isolated from each other. The local wires 192 extend above the power line 910 in the Y direction.

As illustrated in FIGS. 4 and 5, above the fins 181, semiconductor regions 182 extending in the X direction and overlapping the local wires 192 in plan view, are provided.

Each semiconductor region 182 includes multiple P-type regions 182P arranged in the X direction and overlapping the N-type regions 181N in plan view. Here, the semiconductor region 182 includes five P-type regions 182P. Between the semiconductor regions 182, the P-type regions 182P are arranged in the Y direction. Each semiconductor region 182 includes nanowires having corresponding P-type regions 182P interposed. The P-type region 182P serves as the source or drain of the pseudo P-channel MOS transistor 21P.

As illustrated in FIGS. 3 to 6, pseudo gate electrodes 130 common to the pseudo N-channel MOS transistors 21N and the pseudo P-channel MOS transistors 21P, are formed between stacking structures each including the local wire 191 and the local wire 192. Here, as the pseudo gate electrodes 130, pseudo gate electrodes 130A, 130B, 130C, and 130D are formed side by side in the X direction. The pseudo gate electrodes 130 extend in the Y direction. Pseudo gate insulating films 131 are formed between the pseudo gate electrodes 130 and the fins 181, and between the pseudo gate electrodes 130 and the semiconductor regions 182.

As illustrated in FIGS. 5 to 7, an insulating film 151 is formed above the substrate 101 and the element separating film 102. The local wires 191 and 192, and the pseudo gate electrode 130 are embedded in the insulating films 151. Also, in plan view, each local wire 192 does not reach an end of a corresponding local wire 191 on the power line 920 side, and between the end of the local wire 192 on the power line 920 side and the end of the local wire 191 on the power line 920 side, an insulating film 152 is formed over the insulating film 106.

Pseudo gate electrodes 153 are formed over the respective insulating films 151 and 152, the respective local wires 192, and the respective insulating films 130; and insulating films 154 are formed over the respective insulating films 153.

As illustrated in FIG. 7, contact holes 162 reaching the power line 910 are formed in the insulating film 151 and 103 between the local wires 192 and the power line 910. Each local wire 192 is connected to the power line 910 via the conductor in a corresponding contact hole 162. Each local wire 192 electrically connects the power line 910 to corresponding P-type regions 182P.

As illustrated in FIGS. 4 and 6, contact holes 163 reaching corresponding pseudo gate electrodes 130 are formed in the insulating film 153. Two contact holes 163 are formed in each pseudo gate electrode 130. Each contact hole 163 overlaps an end of the pseudo gate electrode 130 in the Y direction in plan view.

In the insulating film 154, signal lines 171IN and 171OUT, and signal lines 172A, 172B, and 172C are formed. The signal lines 171IN and 171OUT, and the signal lines 172A, 172B, and 172C extend in the X direction.

The signal line 171IN is connected to the pseudo gate electrode 130A via the conductor in a corresponding contact hole 163 that reaches the end of the pseudo gate electrode 130A on the power line 910 side. The signal line 171OUT is connected to the pseudo gate electrode 130D via the conductor in a corresponding contact hole 163 that reaches the end of the pseudo gate electrode 130D on the power line 910 side. The signal line 171IN functions as the input terminal 11, and the signal line 171OUT functions as the output terminal 12.

The signal line 172A is connected to the pseudo gate electrode 130A via the conductor in a corresponding contact hole 163 that reaches the end of the pseudo gate electrode 130A on the power line 920 side. The signal line 172A is also connected to the pseudo gate electrode 130B via the conductor in a corresponding contact hole 163 that reaches the end of the pseudo gate electrode 130B on the power line 920 side. The signal line 172B is connected to the pseudo gate electrode 130B via the conductor in a corresponding contact hole 163 that reaches the end of the pseudo gate electrode 130B on the power line 910 side. The signal line 172B is also connected to the pseudo gate electrode 130C via the conductor in a corresponding contact hole 162 that reaches the end of the pseudo gate electrode 130C on the power line 910 side. The signal line 172C is connected to the pseudo gate electrode 130C via the conductor in a corresponding contact hole 163 that reaches the end of the pseudo gate electrode 130C on the power line 920 side. The signal line 172C is also connected to the pseudo gate electrode 130D via the conductor in a corresponding contact hole 163 that reaches the end of the pseudo gate electrode 130D on the power line 920 side.

A structure connecting the signal line 171IN, the pseudo gate electrode 130A, the signal line 172A, the pseudo gate electrode 130B, the signal line 172B, the pseudo gate electrode 130C, the signal line 172C, the pseudo gate electrode 130D, and the signal line 171OUT meanders in plan view.

In the first embodiment, each pseudo CFET 20 functions as a resistor 20R. Therefore, this structure is suitable for even finer microfabrication of semiconductor devices.

Also, since the potential of the N-type regions 181N becomes higher than the potential of the pseudo gate electrodes 130 that are positioned between adjacent N-type regions 181N, in each fin 181, the diode is in a reverse bias state. Therefore, a channel is not formed in the fin 181 between the adjacent N-type regions 181N, and the parasitic capacitance between the fin 181 and the pseudo gate electrode 130 between the adjacent N-type regions 181N, can be suppressed.

Since the potential of the P-type regions 182P becomes higher than the potential of the pseudo gate electrodes 130 that are positioned between adjacent P-type region 182P, in each semiconductor region 182, the diode is in a reverse bias state. Therefore, the parasitic capacitance between the semiconductor region 182 and the pseudo gate electrode 130 between the adjacent P-type regions 182P, can be suppressed.

The number of fins 181 and semiconductor regions 182 is not limited to six, and for example, one to five or seven or more of these elements may be provided. Also in the other embodiments and modified examples, the number of fins and nanowires is not limited in particular. The number of the pseudo gate electrodes 130 is not limited to four, and for example, one to three or five or more may be provided.

In each pseudo CFET 20, the pseudo N-channel MOS transistor 21N may be formed over the pseudo P-channel MOS transistor 21P. Also in the other embodiments and modified examples, the pseudo N-channel MOS transistor included in the pseudo CFET may be formed over the pseudo P-channel MOS transistor, and the N-channel MOS transistor included in the CFET may be formed over the P-channel MOS transistor.

Second Embodiment

Figure 8:
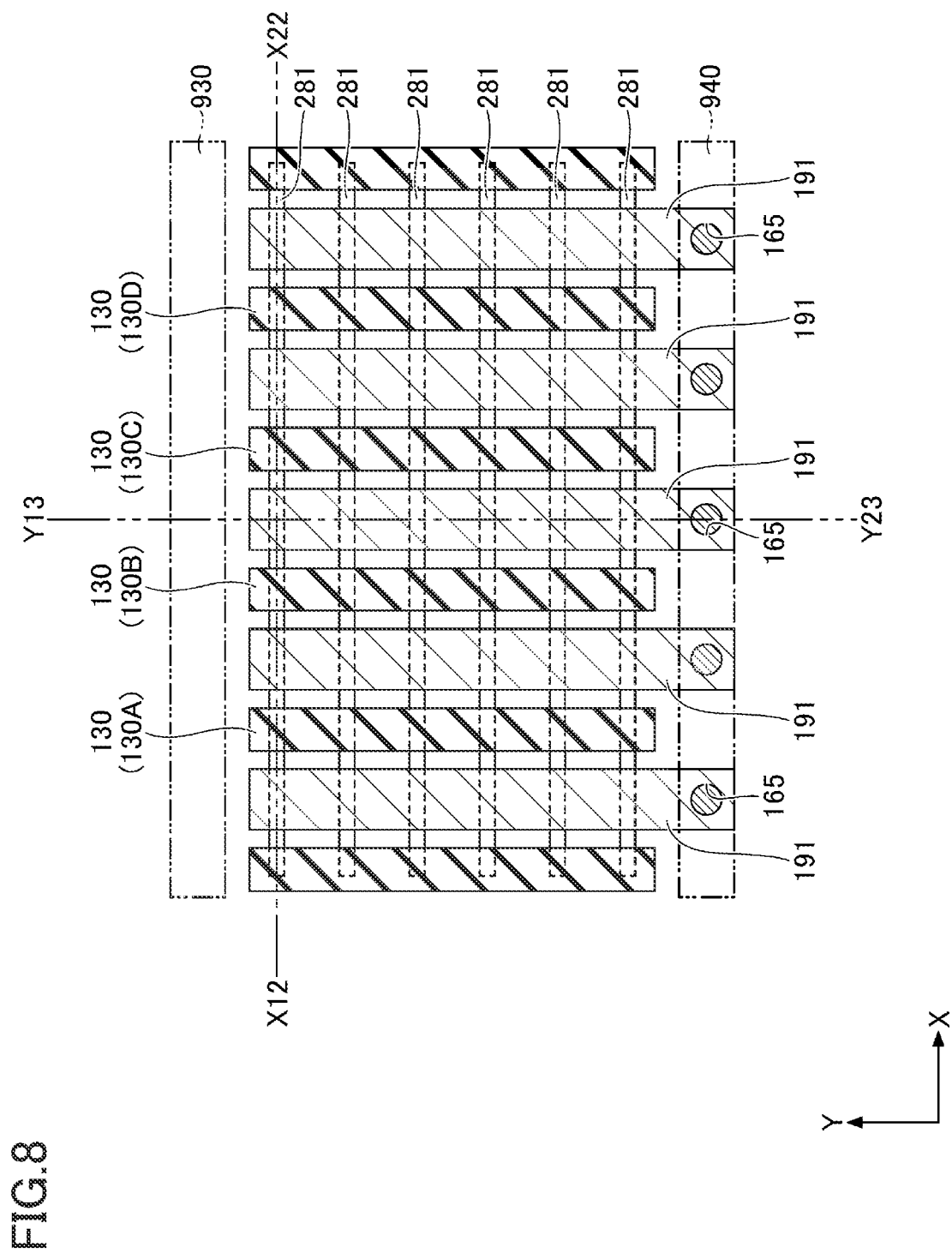
FIG. 8 is a schematic diagram (part 1) illustrating a planar configuration of pseudo CFETs in a second embodiment.
Figure 9:
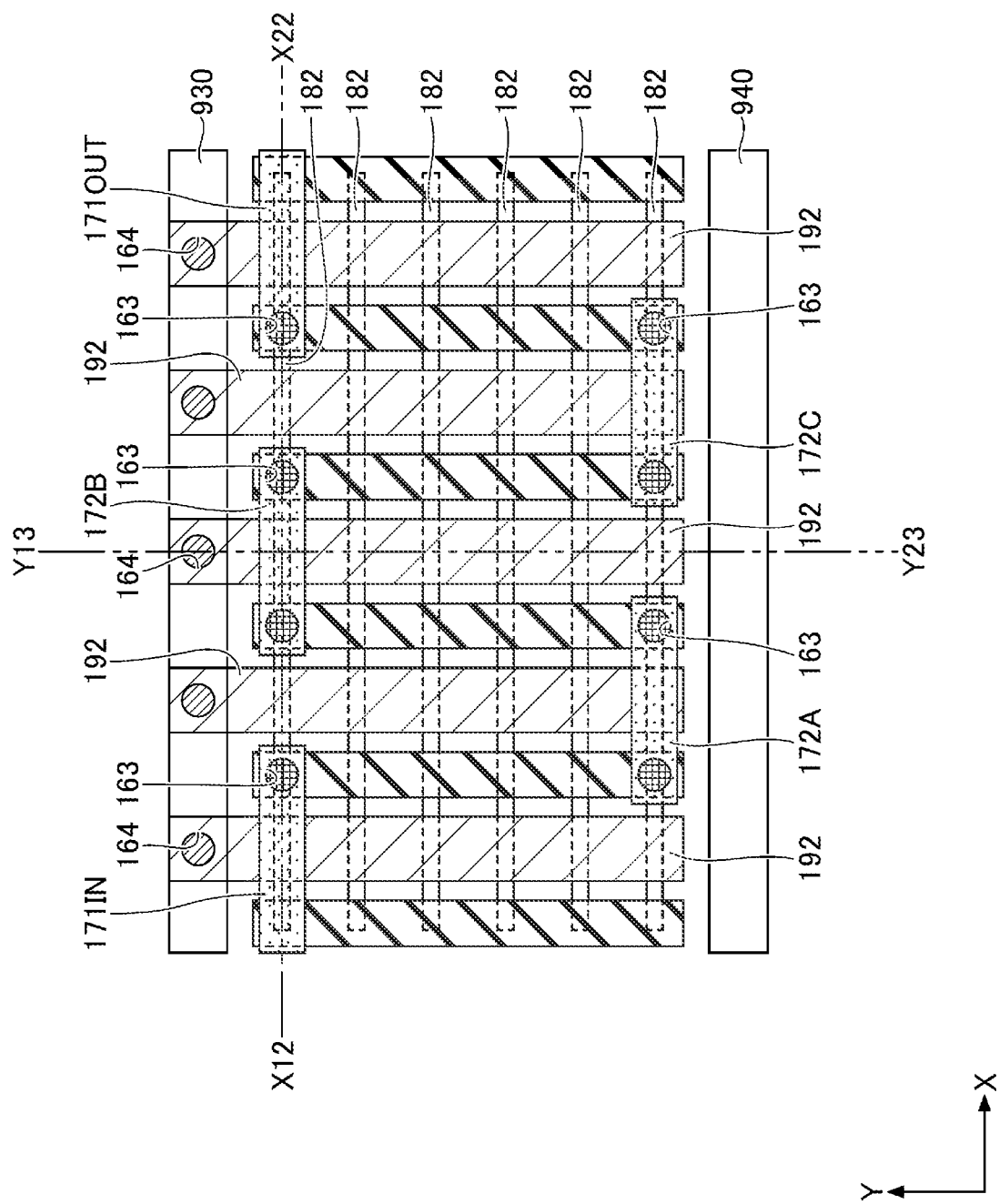
FIG. 9 is a schematic diagram (part 2) illustrating a planar configuration of the pseudo CFETs in the second embodiment.
Figure 10:
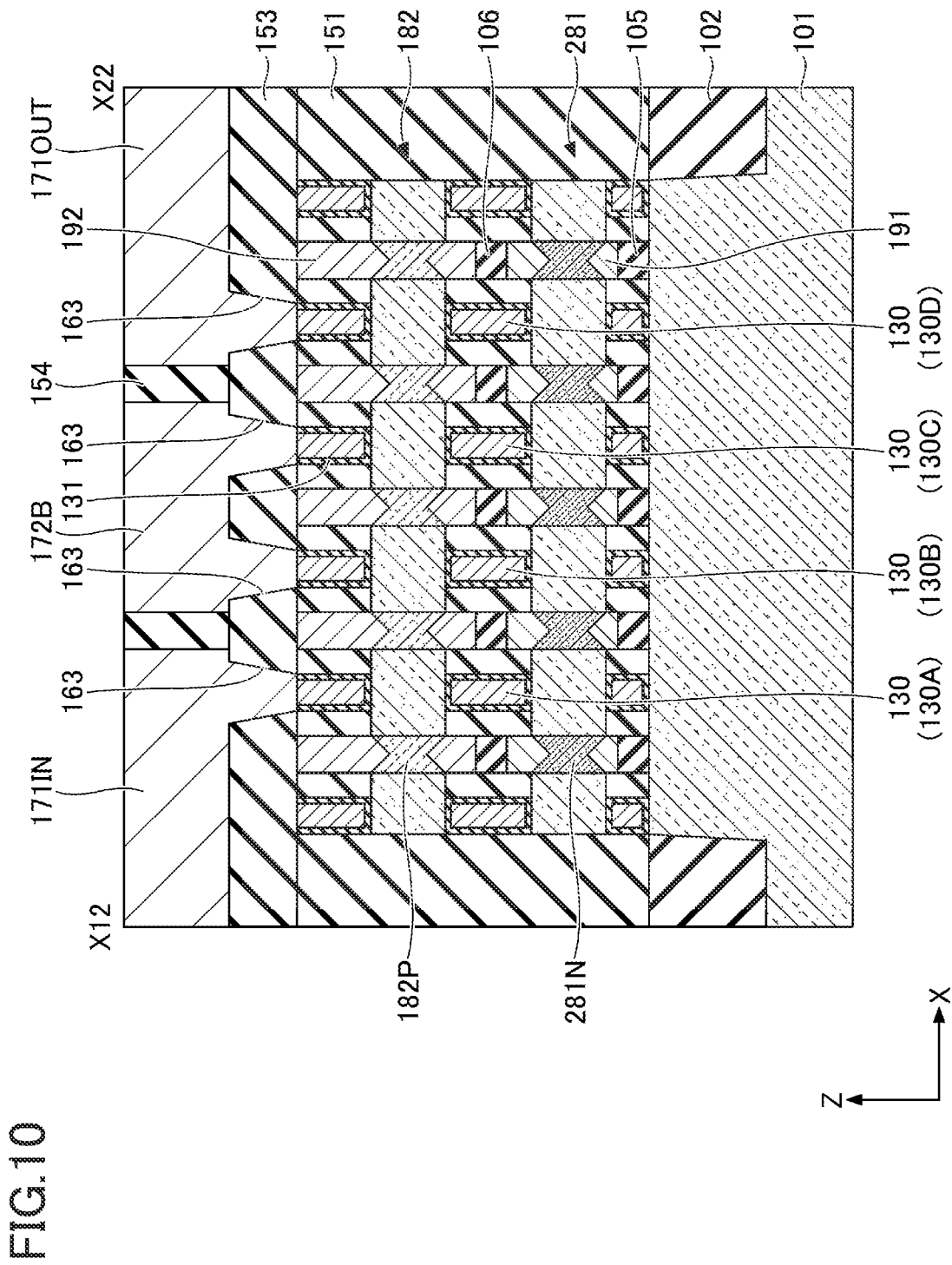
FIG. 10 is a cross sectional view (part 1) illustrating the pseudo CFETs in the second embodiment.
Figure 11:
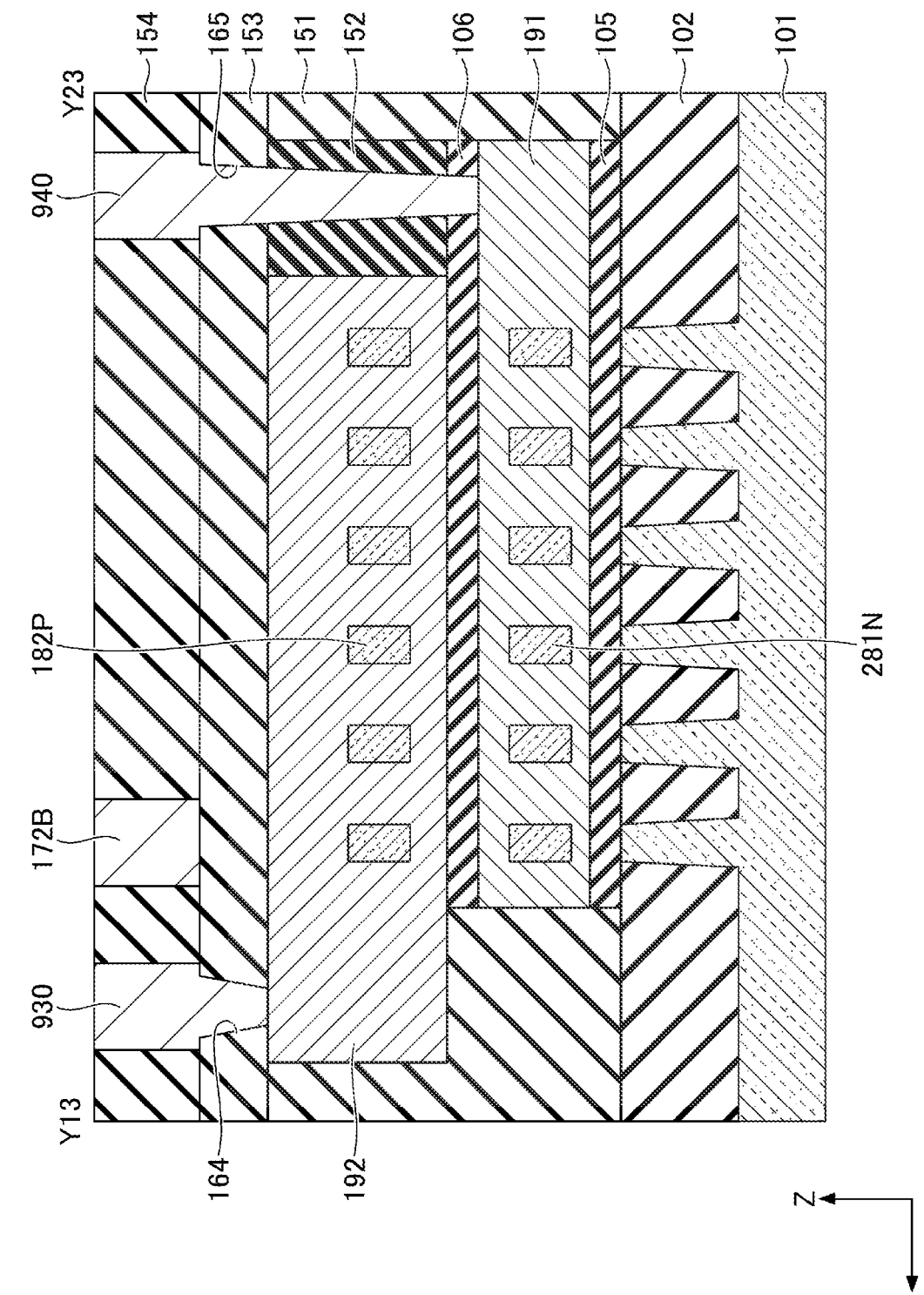
FIG. 11 is a cross sectional view (part 2) illustrating the pseudo CFET in the second embodiment.

Next, a second embodiment will be described. The second embodiment is different from the first embodiment primarily in the configuration of power lines, and in the configuration of semiconductor regions included in a pseudo N-channel MOS transistor. FIGS. 8 and 9 are schematic diagrams illustrating a planar configuration of pseudo CFETs 20 in the second embodiment. FIG. 8 mainly illustrates a layout of pseudo N-channel MOS transistors 21N. FIG. 9 mainly illustrates a layout of pseudo P-channel MOS transistors 21P. Except for structures illustrated in both FIGS. 8 and 9, the structures illustrated in FIG. 9 are positioned above the structures illustrated in FIG. 8. FIGS. 10 and 11 are cross sectional views illustrating the pseudo CFETs 20 in the second embodiment. FIG. 10 corresponds to a cross sectional view along a line X12-X22 in FIGS. 8 and 9. FIG. 11 corresponds to a cross sectional view along a line Y13-Y23 in FIGS. 8 and 9.

In the second embodiment, as illustrated in FIGS. 10 and 11, an insulating film 105 is formed between the lower surface of each local wire 191 and the upper surface of a substrate 101. Below semiconductor regions 182, semiconductor regions 281 extending in the X direction and overlapping the local wires 191 in plan view, are provided. Each semiconductor region 281 includes multiple N-type regions 281N arranged in the X direction and overlapping the P-type regions 182P in plan view. Here, the semiconductor region 281 includes five N-type regions 281N. Across the semiconductor regions 281, the N-type regions 281N are arranged side by side in the Y direction. Each semiconductor region 281 includes nanowires having corresponding N-type regions 281N interposed. The N-type region 281N serves as the source or drain of the pseudo N-channel MOS transistor 21N.

Multiple trenches extending in the X direction are formed in an insulating film 154, and power lines 930 and 940 are formed in these trenches. The power line 930 is provided above ends of the local wires 192 along signal lines 171IN, 172B, and 171OUT. The power line 940 is provided above ends of the local wires 191 along signal lines 172A and 172C. The power line 930 corresponds to the VSS wire, and the power line 940 corresponds to the VDD wire.

Between the power line 930 and the local wires 192, through an insulating film 153, contact holes 164 reaching the local wires 192 are formed. The power line 930 is connected to each local wire 192 via the conductor in a corresponding contact hole 164. Each local wire 192 electrically connects the power line 930 to corresponding P-type regions 182P.

Between the power line 940 and the local wires 191, through the insulating films 153, 152, and 106, contact holes 165 reaching the local wires 191 are formed. The power line 940 is connected to each local wire 191 via the conductor in a corresponding contact hole 165. Each local wire 191 electrically connects the power line 940 to corresponding N-type regions 281N.

The other elements are substantially the same as in the first embodiment.

Substantially the same effects can be obtained in the second embodiment as in the first embodiment. Also in the other embodiments and modified examples, a semiconductor region 281 may be used in place of the fin 181. Further, also in the other embodiments and modified examples, a power line 930 may be used in place of the power line 910, and a power line 940 may be used in place of the power line 920.

Figure 12:
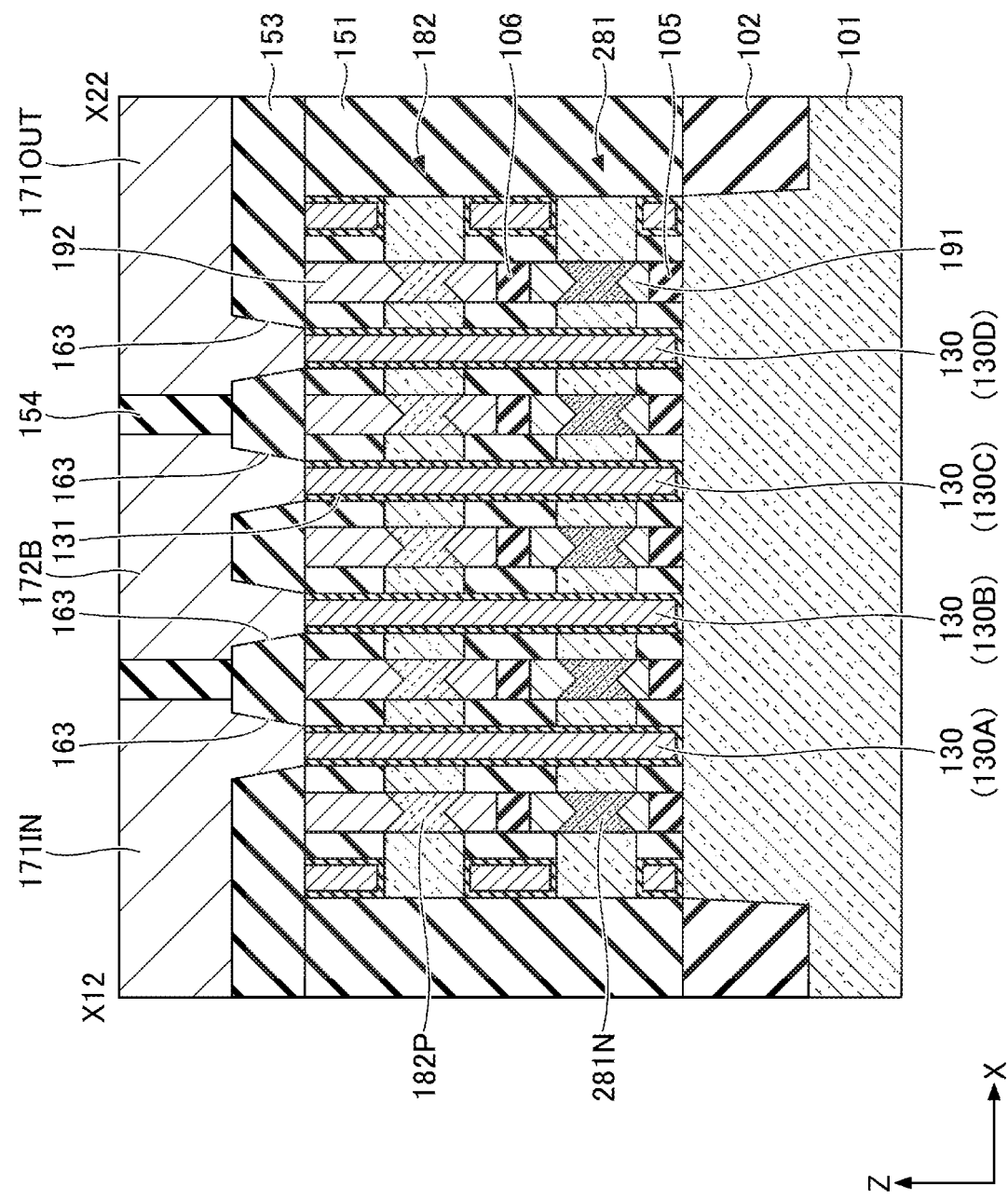
FIG. 12 is a cross sectional view illustrating pseudo CFETs in a modified example of the second embodiment.

Note that as illustrated in FIG. 12, part of the semiconductor regions 182 or 281 may or may not be provided. The electric resistance of the pseudo gate electrodes 130 can be adjusted depending on the number of semiconductor regions 182 or 281.

Third Embodiment

Figure 13:
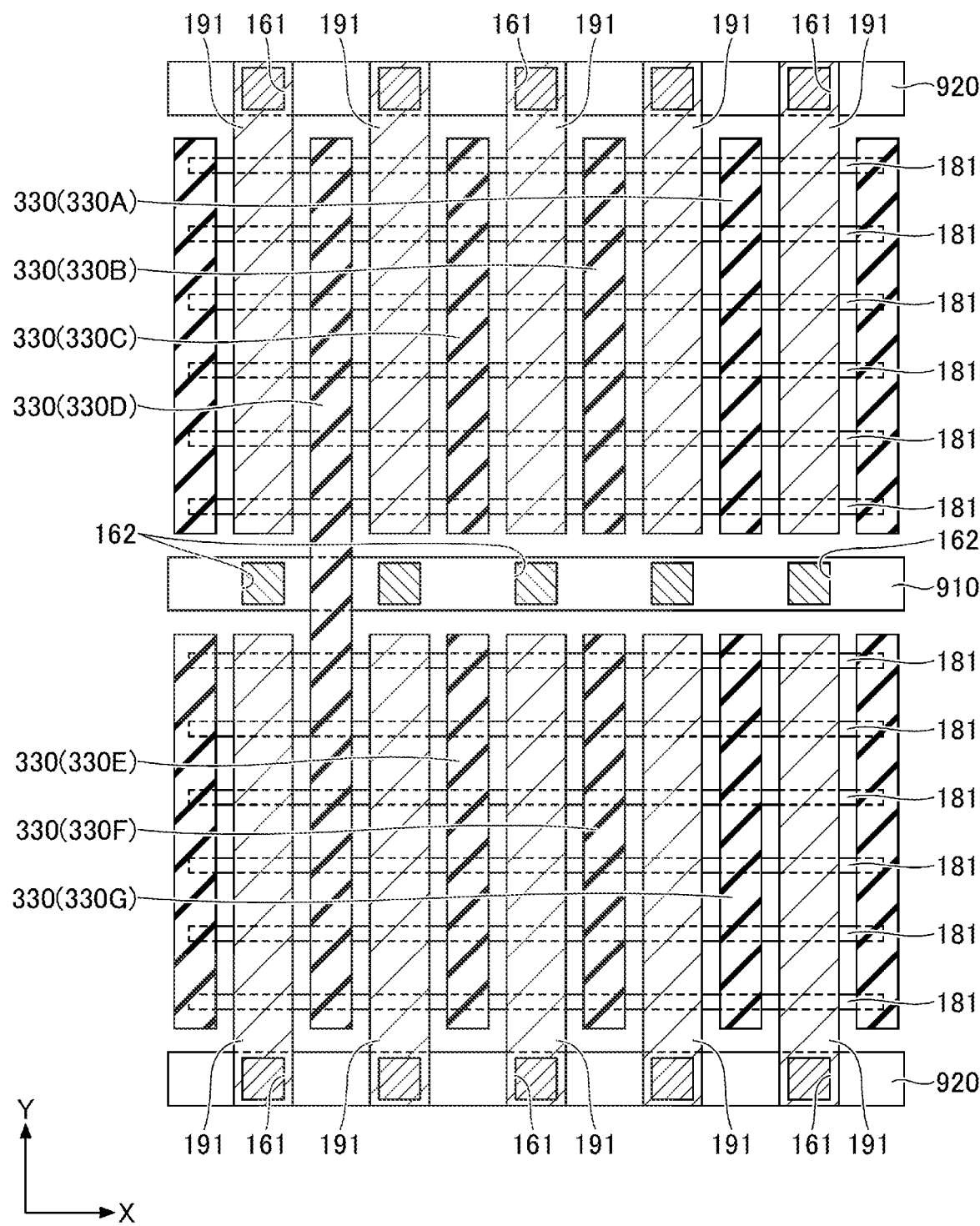
FIG. 13 is a schematic diagram (part 1) illustrating a planar configuration of pseudo CFETs in a third embodiment.
Figure 14:
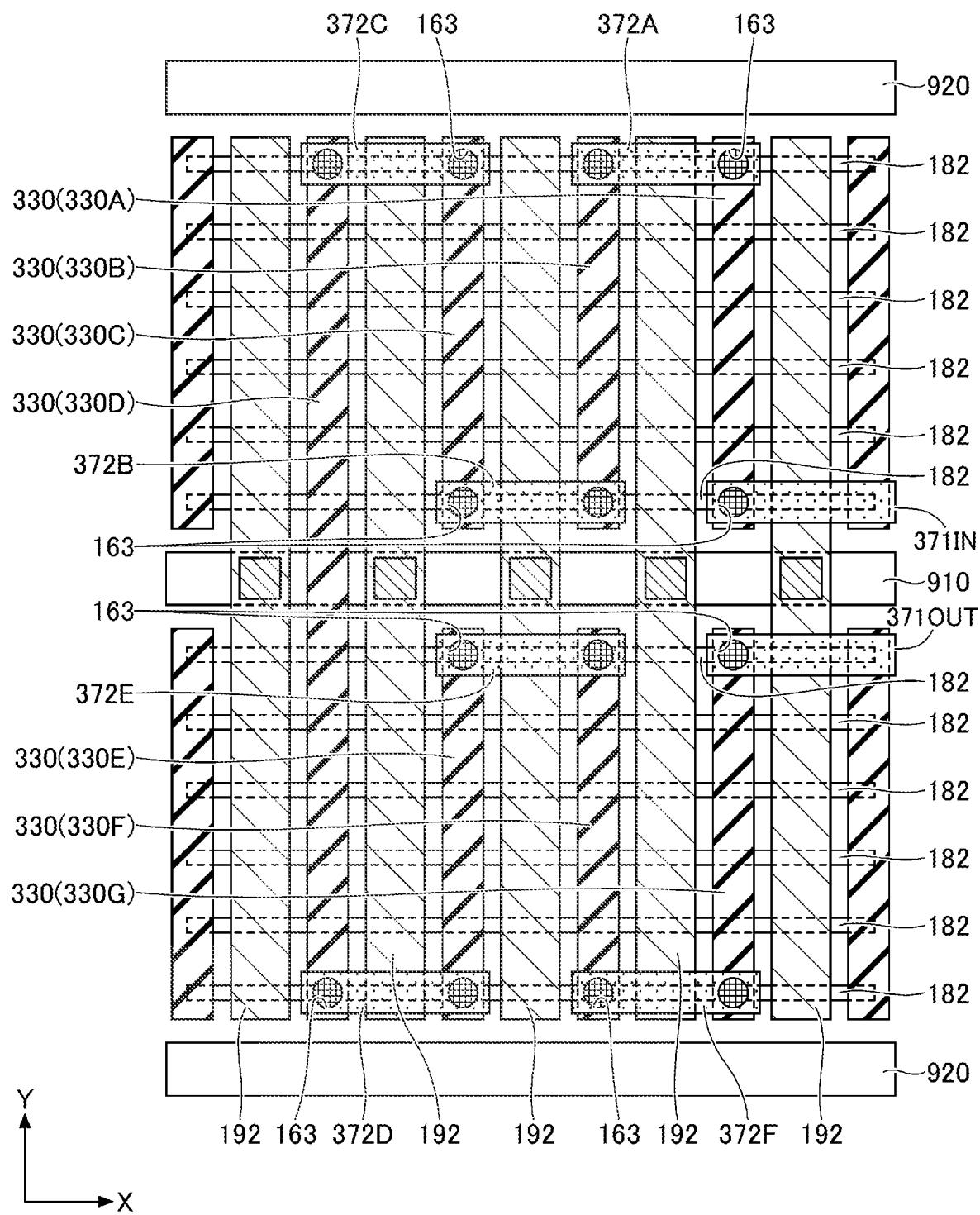
FIG. 14 is a schematic diagram (part 2) illustrating a planar configuration of the pseudo CFETs in the third embodiment.

Next, a third embodiment will be described. The third embodiment is different from the first embodiment primarily in the size of the pseudo CFET. FIGS. 13 and 14 are schematic diagrams illustrating a planar configuration of pseudo CFETs 20 in the third embodiment. FIG. 13 mainly illustrates a layout of pseudo N-channel MOS transistors 21N. FIG. 14 mainly illustrates a layout of pseudo P-channel MOS transistors 21P. Except for structures illustrated in both FIGS. 13 and 14, the structures illustrated in FIG. 14 are positioned above the structures illustrated in FIG. 13.

As illustrated in FIGS. 13 and 14, in the third embodiment, a power line 910 is provided between two power lines 920. This configuration is linearly symmetric with respect to the power line 910 as the axis of symmetry, between a half on one power line 920 side and another half on another power line 920 side.

In the third embodiment, as illustrated in FIGS. 13 and 14, pseudo gate electrodes 330 common to the pseudo N-channel MOS transistors 21N and the pseudo P-channel MOS transistors 21P, are formed between stacking structures each including a local wire 191 and a local wire 192. Here, in the half on the one power line 920 side, as pseudo gate electrodes 330, pseudo gate electrodes 330A, 330B, 330C, and 330D are formed side by side in the X direction. The pseudo gate electrode 330D extends to the other power line 920 side. In addition, in the half on the one power line 920 side, as the pseudo gate electrodes 330, pseudo gate electrodes 330D, 330E, 330F, and 330G are formed side by side in the X direction that is reverse to the direction in which the pseudo gate electrodes 330A, 330B, 330C, and 330D are arranged side by side in this order. The pseudo gate electrode 330E is positioned on an extended line of the pseudo gate electrode 330C, the pseudo gate electrode 330F is positioned on an extended line of the pseudo gate electrode 330B, and the pseudo gate electrode 330G is positioned on an extended line of the pseudo gate electrode 330A. The pseudo gate electrodes 330 extend in the Y direction. Pseudo gate insulating films (not illustrated) substantially the same as the pseudo gate insulating films 131 are formed between the pseudo gate electrodes 330 and fins 181, and between the pseudo gate electrodes 330 and semiconductor regions 182.

In an insulating film 154, signal lines 371IN and 371OUT, and signal lines 372A, 372B, 372C, 372D, 372E, and 372F are formed. The signal lines 371IN and 371OUT, and the signal lines 372A, 372B, 372C, 372D, 372E, and 372F extend in the X direction.

The signal line 371IN is connected to the pseudo gate electrode 330D via the conductor in a corresponding contact hole 162 that reaches the end of the pseudo gate electrode 330D on the power line 910 side. The signal line 371OUT is connected to the pseudo gate electrode 330G via the conductor in a corresponding contact hole 162 that reaches the end of the pseudo gate electrode 330G on the power line 910 side. The signal line 371IN functions as the input terminal 11, and the signal line 371OUT functions as the output terminal 12.

The signal line 372A is connected to the pseudo gate electrode 330A via the conductor in a corresponding contact hole 162 that reaches the end of the pseudo gate electrode 330A on the power line 920 side. The signal line 372A is also connected to the pseudo gate electrode 330B via the conductor in a corresponding contact hole 162 that reaches the end of the pseudo gate electrode 330B on the power line 920 side. The signal line 372B is connected to the pseudo gate electrode 330B via the conductor in a corresponding contact hole 162 that reaches the end of the pseudo gate electrode 330B on the power line 910 side. The signal line 372B is also connected to the pseudo gate electrode 330C via the conductor in a corresponding contact hole 162 that reaches the end of the pseudo gate electrode 330C on the power line 910 side. The signal line 372C is connected to the pseudo gate electrode 330C via the conductor in a corresponding contact hole 162 that reaches the end of the pseudo gate electrode 330C on the power line 920 side. The signal line 372C is also connected to the pseudo gate electrode 330D via the conductor in a corresponding contact hole 162 that reaches the end of the pseudo gate electrode 330D on the power line 920 side.

The signal line 372D is connected to the pseudo gate electrode 330D via the conductor in a corresponding contact hole 162 that reaches the other end of the pseudo gate electrode 330D on the power line 920 side. The signal line 372D is also connected to the pseudo gate electrode 330E via the conductor in a corresponding contact hole 162 that reaches the end of the pseudo gate electrode 330E on the power line 920 side. The signal line 372E is connected to the pseudo gate electrode 330E via the conductor in a corresponding contact hole 162 that reaches the end of the pseudo gate electrode 330E on the power line 910 side. The signal line 372E is also connected to the pseudo gate electrode 330F via the conductor in a corresponding contact hole 162 that reaches the end of the pseudo gate electrode 330F on the power line 910 side. The signal line 372F is connected to the pseudo gate electrode 330F via the conductor in a corresponding contact hole 162 that reaches the end of the pseudo gate electrode 330F on the power line 920 side. The signal line 372F is also connected to the pseudo gate electrode 330G via the conductor in a corresponding contact hole 162 that reaches the end of the pseudo gate electrode 330G on the power line 920 side.

A structure connecting the signal line 371IN, the pseudo gate electrode 330A, the signal line 372A, the pseudo gate electrode 330B, the signal line 372B, the pseudo gate electrode 330C, the signal line 372C, and the pseudo gate electrode 330D meanders in plan view. Further, A structure connecting the pseudo gate electrode 330D, the signal line 372D, the pseudo gate electrode 330E, the signal line 372E, the pseudo gate electrode 330F, the signal line 372F, the pseudo gate electrode 330G, and the signal line 371OUT also meanders in plan view.

Note that in FIGS. 13 and 14, although the configuration of the pseudo CFETs is linearly symmetric with respect to the power line 910, it does not need to be linearly symmetric. For example, the numbers and the lengths of the pseudo gate electrodes may be different across the power line 910.

The other elements are substantially the same as in the first embodiment.

Substantially the same effects can be obtained in the third embodiment as in the first embodiment. As long as the dimensions and the materials of the fins, the nanowires, the local wires, and the like are the same, greater electric resistance can be obtained.

Fourth Embodiment

Figure 15:
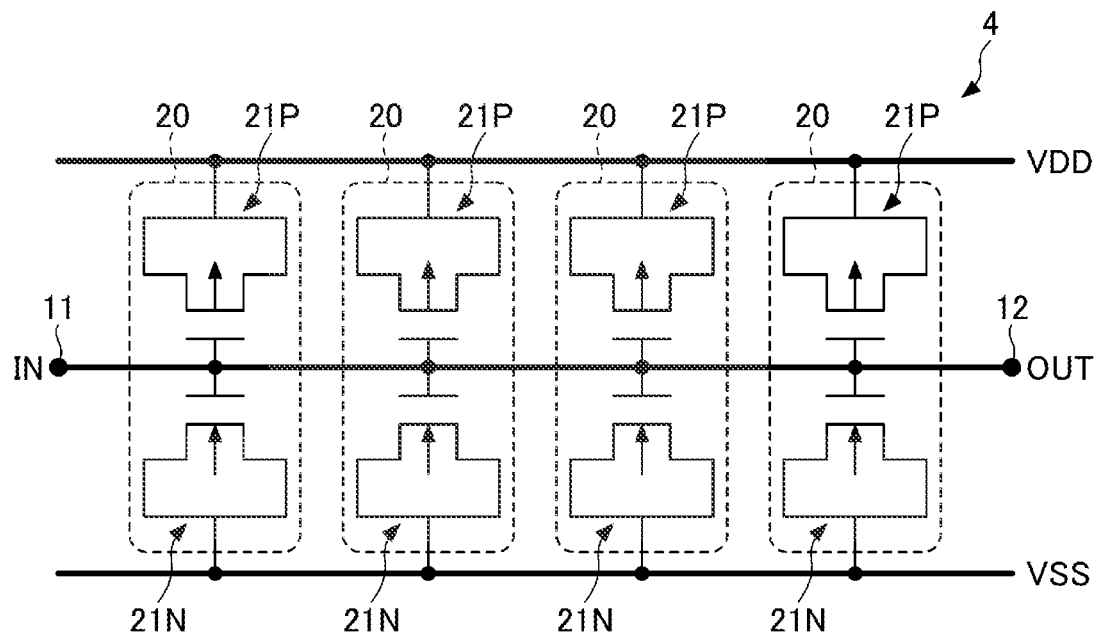
FIG. 15 is a circuit diagram illustrating a configuration of a semiconductor device according to a fourth embodiment.
Figure 16:
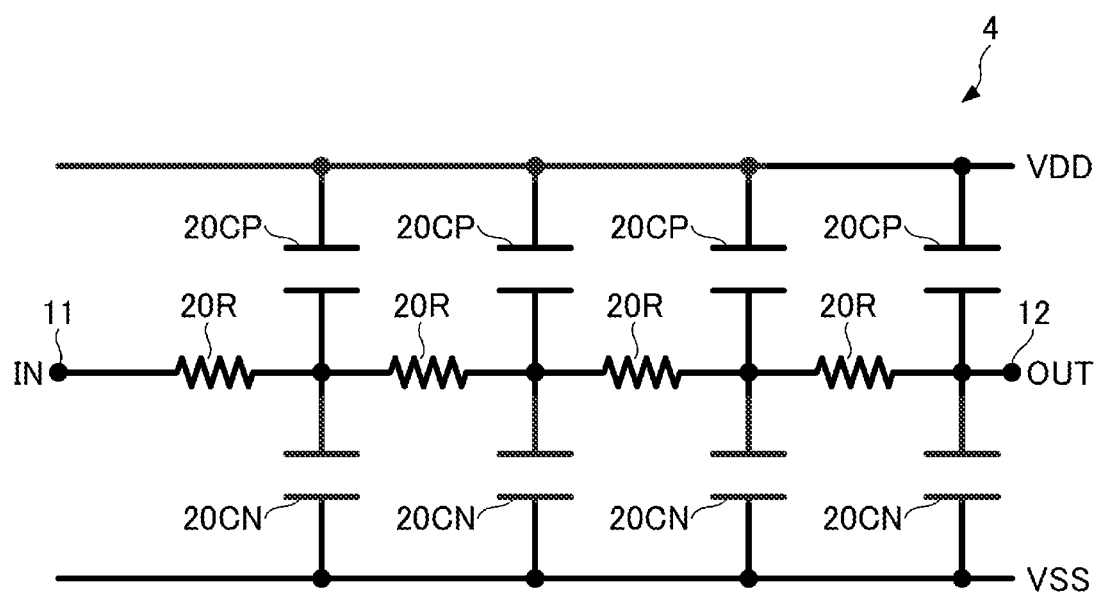
FIG. 16 is an equivalent circuit diagram of the circuit diagram illustrated in FIG. 15.

Next, a fourth embodiment will be described. The fourth embodiment is different from the first embodiment primarily in the relationship of connections between the pseudo CFETs and the power lines. FIG. 15 is a circuit diagram illustrating a configuration of a semiconductor device according to the fourth embodiment. FIG. 16 is an equivalent circuit diagram of the circuit diagram illustrated in FIG. 15.

As illustrated in FIG. 15, in a semiconductor device 4 according to the fourth embodiment, in the pseudo N-channel MOS transistor 21N, a portion corresponding to the source and a portion corresponding to the drain of an N-channel MOS transistor are both are connected to the VSS wire. In the pseudo P-channel MOS transistor 21P, a portion corresponding to the source and a portion corresponding to the drain of a P-channel MOS transistor are both are connected to the VDD wire.

As illustrated in FIG. 16, each pseudo CFET 20 functions as a CR element provided with a resistor 20R, a capacitor 20CN, and a capacitor CP. The CR elements are connected in series between the input terminal 11 and the output terminal 12. In other words, the semiconductor device 4 has resistor elements including the four CR elements.

Figure 17:
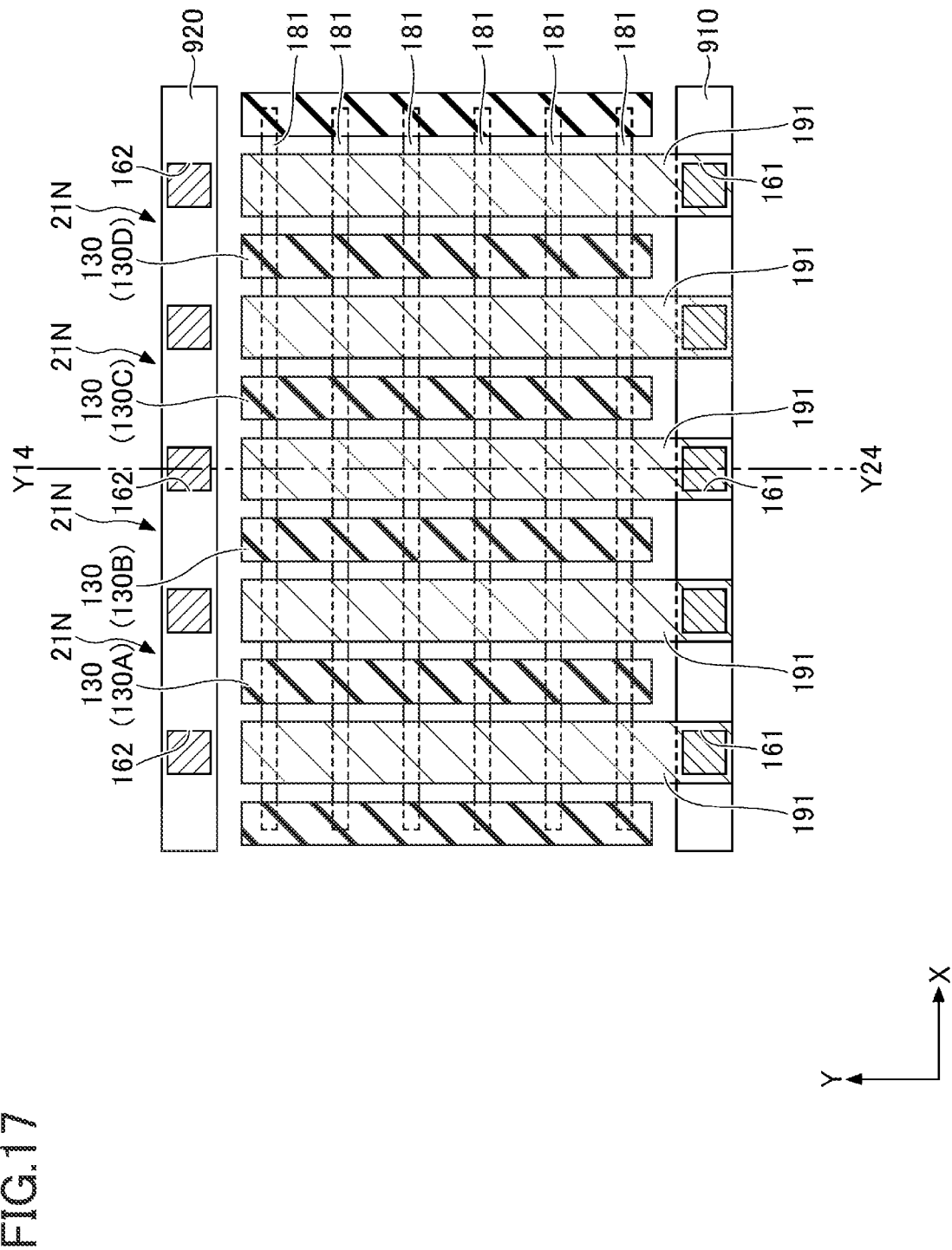
FIG. 17 is a schematic diagram (part 1) illustrating a planar configuration of pseudo CFETs in the fourth embodiment.
Figure 18:
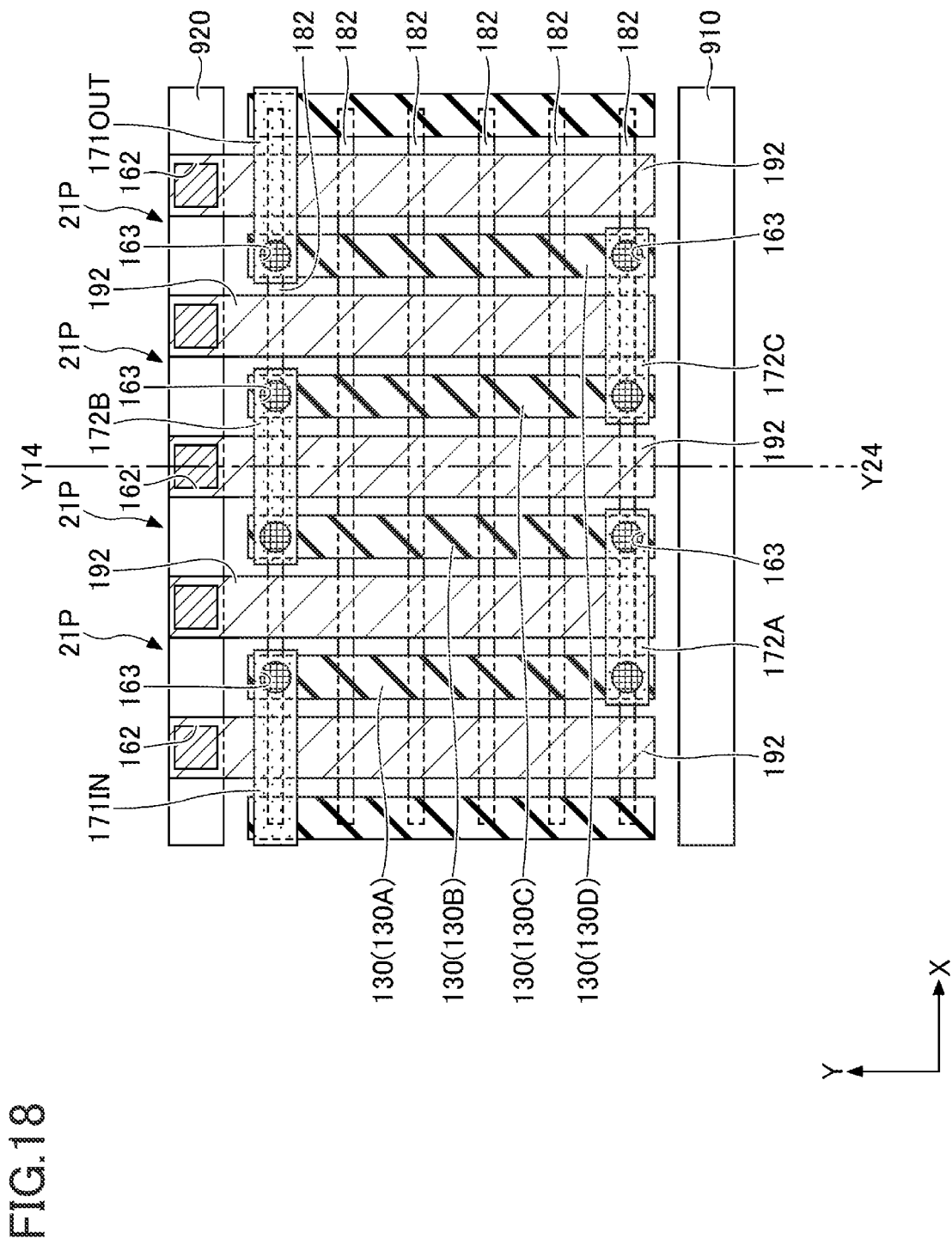
FIG. 18 is a schematic diagram (part 2) illustrating a planar configuration of the pseudo CFETs in the fourth embodiment.
Figure 19:
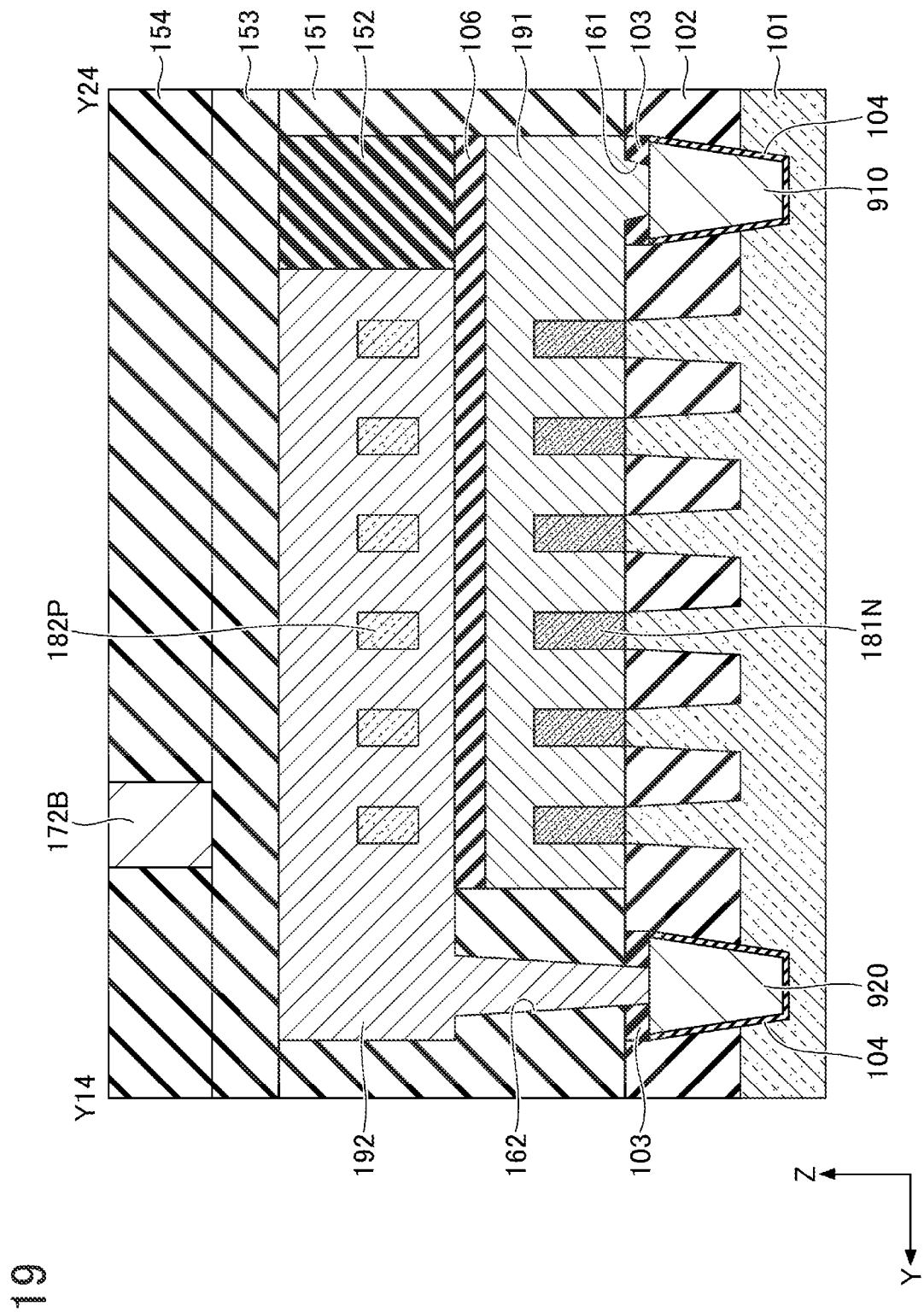
FIG. 19 is a cross sectional view illustrating the pseudo CFET in the fourth embodiment.

Next, a configuration of the pseudo CFETs 20 in the fourth embodiment will be described. FIGS. 17 and 18 are schematic diagrams illustrating a planar configuration of the pseudo CFETs 20 in the fourth embodiment. FIG. 17 mainly illustrates a layout of the pseudo N-channel MOS transistors 21N. FIG. 18 mainly illustrates a layout of the pseudo P-channel MOS transistors 21P. Except for structures illustrated in both FIGS. 17 and 18, the structures illustrated in FIG. 18 are positioned above the structures illustrated in FIG. 17. FIG. 19 is a cross sectional view illustrating the pseudo CFET 20 in the fourth embodiment. FIG. 19 corresponds to a cross sectional view along a line Y14-Y24 in FIGS. 17 and 18.

In the fourth embodiment, as illustrated in FIGS. 17 to 19, compared to the first embodiment, the positions of the power lines 910 and 920 are swapped. In addition, each local wire 191 extends above the power line 910, and is connected to the power line 910 via the conductor in a corresponding contact hole 161. Each local wire 192 extends above the power line 920, and is connected to the power line 920 via the conductor in a corresponding contact hole 162 in the Y direction. Each local wire 191 electrically connects the power line 910 to corresponding N-type regions 181N. Each local wire 192 electrically connects the power line 920 to corresponding P-type regions 182P.

The other elements are substantially the same as in the first embodiment.

In the fourth embodiment, since the potential of the N-type regions 181N becomes lower than the potential of the pseudo gate electrodes 130 that are positioned between adjacent N-type region 181N, in each fin 181, the diode is in a forward bias state. Therefore, a parasitic capacitance can be generated between a fin 181 and a pseudo gate electrode 130 between adjacent N-type regions 181N, to function as a capacitive element.

Since the potential of the P-type regions 182P becomes higher than the potential of the pseudo gate electrodes 130 that are positioned between adjacent P-type regions 182P, the diode is in a forward bias state. Therefore, a parasitic capacitance can be generated between a semiconductor region 182 and a pseudo gate electrode 130 between adjacent P-type regions 182P, to function as a capacitive element.

In this way, in the fourth embodiment, each pseudo CFET 20 functions as a CR element including a resistor 20R. Therefore, this structure is suitable for even finer microfabrication of semiconductor devices.

Also, in the fourth embodiment, when a current flows between the input terminal 11 and the output terminal 12, the potential of the input terminal 11 becomes higher than the potential of the output terminal 12. Therefore, the potential difference between the input terminal 11 and the VSS wire becomes greater, the potential difference between the input terminal 11 and the VDD wire becomes smaller, and the capacity between the input terminal 11 and the VSS wire becomes greater. Also, the potential difference between the output terminal 12 and the VSS wire becomes smaller, the potential difference between the output terminal 12 and the VDD wire becomes greater, and the capacity between the output terminal 12 and the VDD wire becomes greater. As a result, the capacitive uniformity can be increased among parts of the pseudo gate electrodes 130.

Fifth Embodiment

Figure 20:
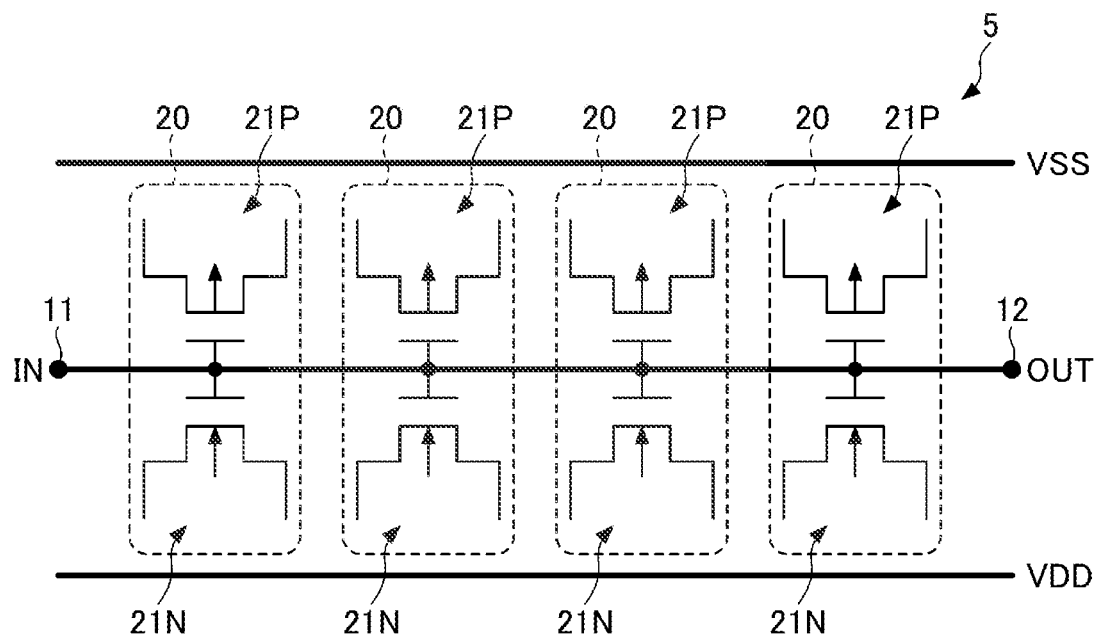
FIG. 20 is a circuit diagram illustrating a configuration of a semiconductor device according to a fifth embodiment.
Figure 21:
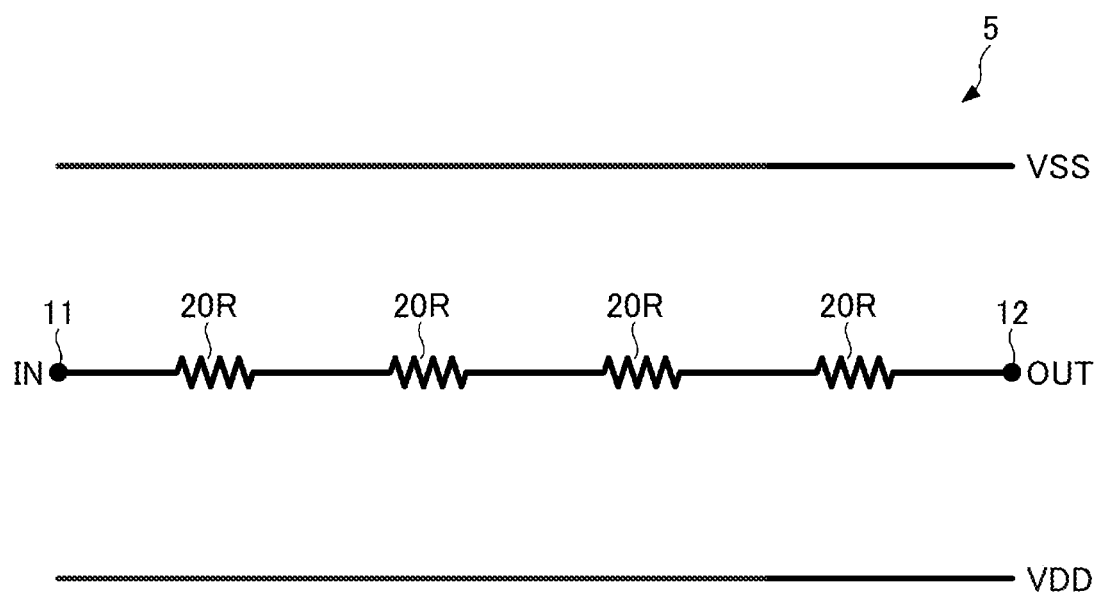
FIG. 21 is an equivalent circuit diagram of the circuit diagram illustrated in FIG. 20.

Next, a fifth embodiment will be described. The fifth embodiment is different from the first embodiment primarily in the relationship of connections between the pseudo CFET and the power lines. FIG. 20 is a circuit diagram illustrating a configuration of a semiconductor device according to the fifth embodiment. FIG. 21 is an equivalent circuit diagram of the circuit diagram illustrated in FIG. 20.

As illustrated in FIG. 20, in a semiconductor device 5 according to the fifth embodiment, in the pseudo N-channel MOS transistor 21N, a portion corresponding to the source and a portion corresponding to the drain of an N-channel MOS transistor are both electrically floating (open). In the pseudo P-channel MOS transistor 21P, a portion corresponding to the source and a portion corresponding to the drain of a P-channel MOS transistor are both electrically floating (open).

As illustrated in FIG. 21, each pseudo CFET 20 functions as a resistor 20R. The resistors 20R are connected in series between the input terminal 11 and the output terminal 12. In other words, the semiconductor device 5 has resistor elements including the four resistors 20R.

Figure 22:
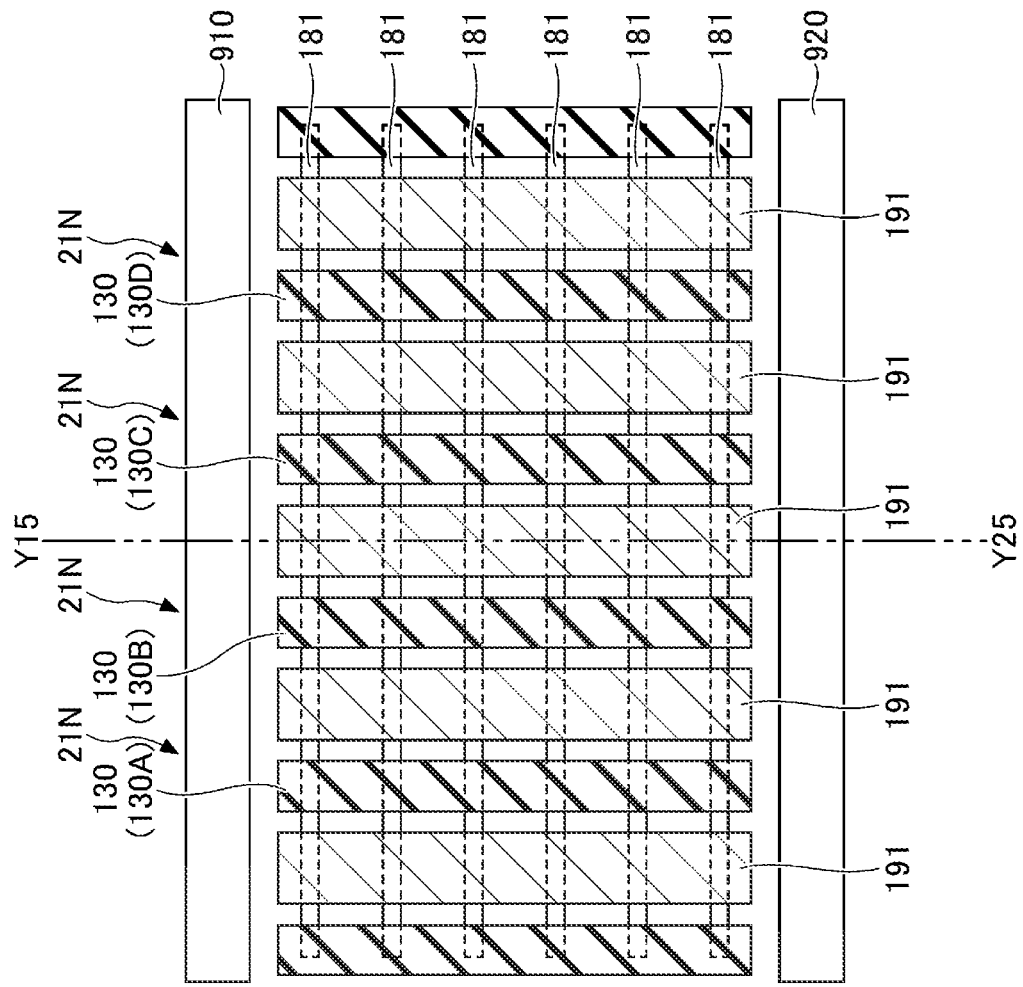
FIG. 22 is a schematic diagram (part 1) illustrating a planar configuration of pseudo CFETs in the fifth embodiment.
Figure 23:
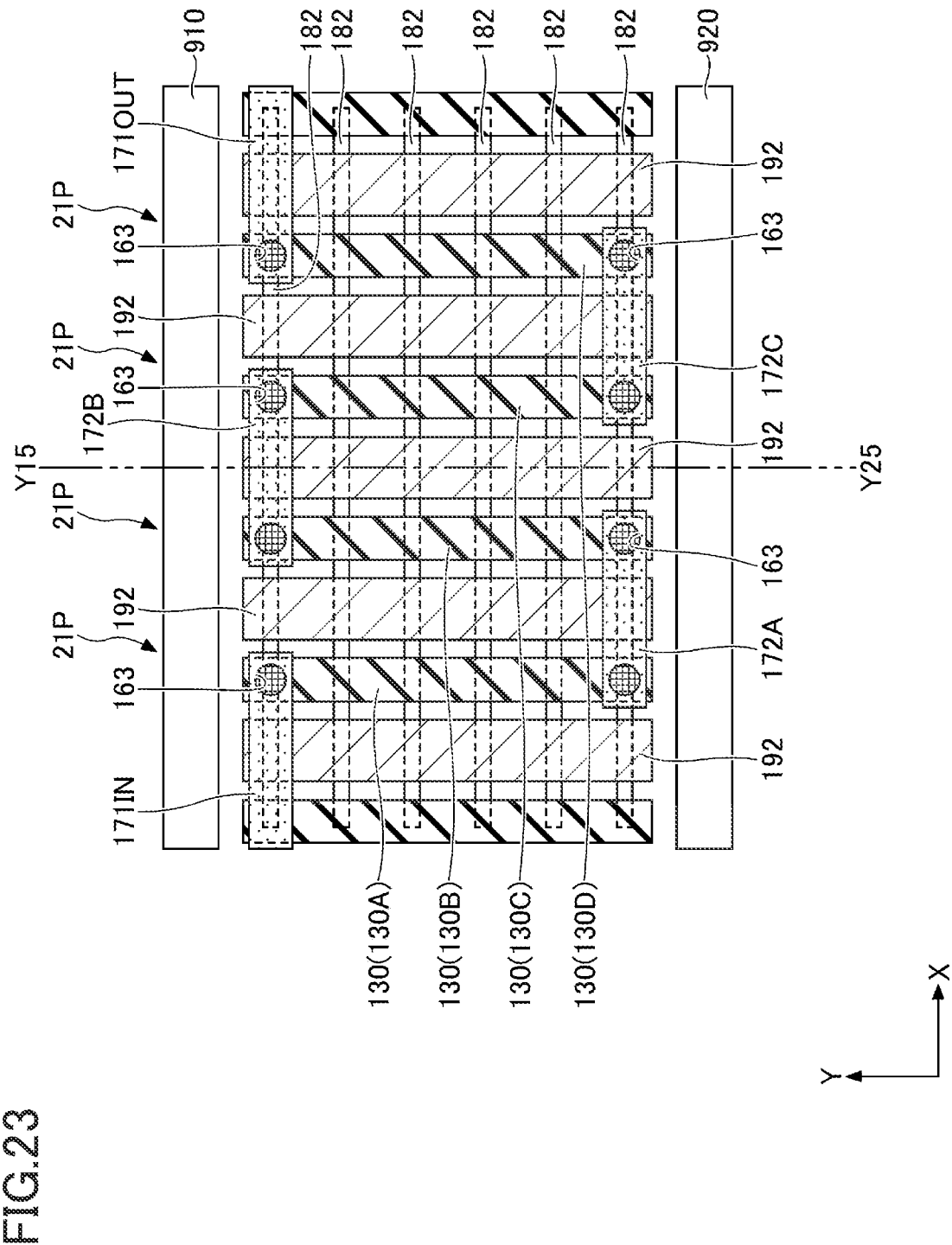
FIG. 23 is a schematic diagram (part 2) illustrating a planar configuration of the pseudo CFETs in the fifth embodiment.
Figure 24:
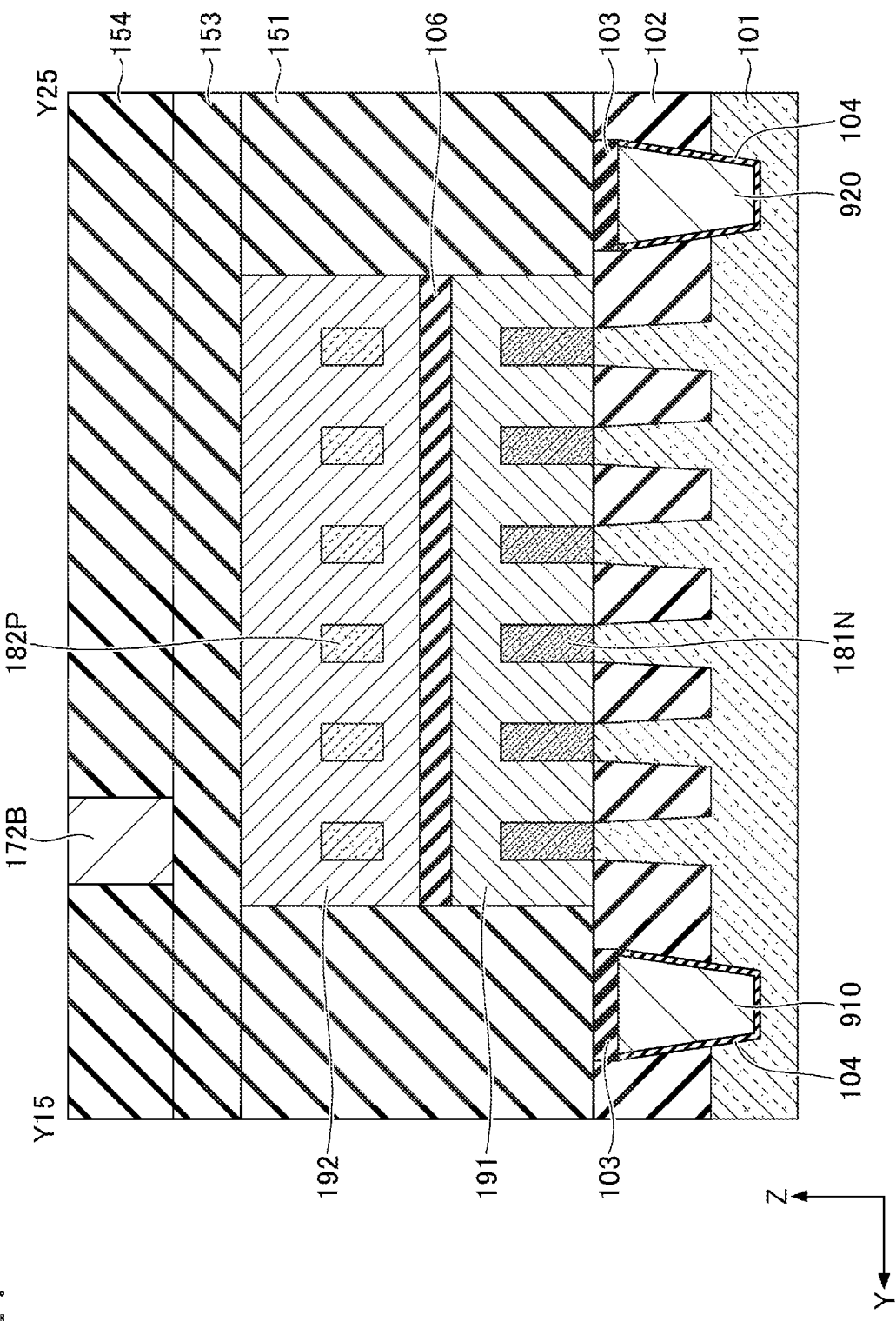
FIG. 24 is a cross sectional view illustrating the pseudo CFET in the fifth embodiment.

Next, a configuration of the pseudo CFET 20 in the fifth embodiment will be described. FIGS. 22 and 23 are schematic diagrams illustrating a planar configuration of the pseudo CFET 20 in the fifth embodiment. FIG. 22 mainly illustrates a layout of the pseudo N-channel MOS transistors 21N. FIG. 23 mainly illustrates a layout of the pseudo P-channel MOS transistors 21P. Except for structures illustrated in both FIGS. 22 and 23, the structures illustrated in FIG. 23 are positioned above the structures illustrated in FIG. 22. FIG. 24 is a cross sectional view illustrating the pseudo CFET 20 in the fifth embodiment. FIG. 24 corresponds to a cross sectional view along a line Y15-Y25 in FIGS. 22 and 23.

In the fifth embodiment, as illustrated in FIGS. 22 to 24, each local wire 191 is electrically isolated and separated from the power lines 910 and 920, and each local wire 192 is also electrically isolated and separate from the power lines 910 and 920.

The other elements are substantially the same as in the first embodiment.

In the fifth embodiment, each pseudo CFET 20 functions as a resistor 20R. Therefore, this structure is suitable for even finer microfabrication of semiconductor devices.

Also, the electric fields between the pseudo gate electrodes 130 and the fins 181, and the semiconductor regions 182 can be suppressed such that breakdown of the pseudo gate insulating film 131 is unlikely to occur.

Sixth Embodiment

Figure 25:
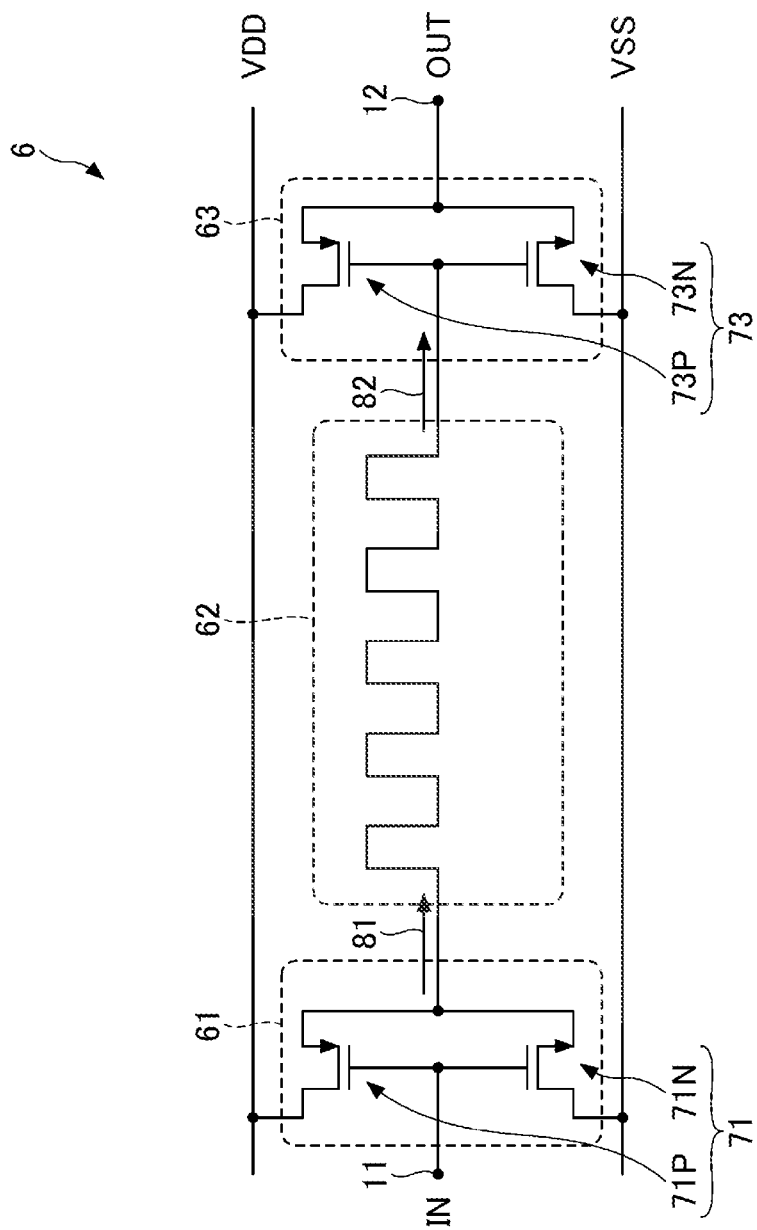
FIG. 25 is a circuit diagram illustrating a configuration of a semiconductor device according to a sixth embodiment.

Next, a sixth embodiment will be described. FIG. 25 is a circuit diagram illustrating a configuration of a semiconductor device according to the sixth embodiment.

As illustrated in FIG. 25, a semiconductor device 6 according to the sixth embodiment includes an input terminal 11 to receive an input signal IN as input, and an output terminal 12 to output an output signal OUT. The semiconductor device 6 includes an inverter 61, a delay adjusting part 62, and an inverter 63 between the input terminal 11 and the output terminal 12. The delay adjusting part 62 is connected between the inverter 61 and the inverter 63. The inverter 61 includes a CFET 71 provided with an N-channel MOS transistor 71N and a P-channel MOS transistor 71P, and the inverter 63 includes a CFET 73 provided with an N-channel MOS transistor 73N and a P-channel MOS transistor 73P. The delay adjusting part 62 includes two pseudo CFETs each provided with a pseudo N-channel MOS transistor 72N and a pseudo P-channel MOS transistor 72P (see FIGS. 26, 27, and 29).

As will be described in detail later, the P-channel MOS transistor 71P is formed over the N-channel MOS transistor 71N, and the P-channel MOS transistor 73P is formed over the N-channel MOS transistor 73N. The pseudo P-channel MOS transistor 72P is formed over the pseudo N-channel MOS transistor 72N. In the N-channel MOS transistors 71N and 73N, the source is connected to the VSS wire, and in the P-channel MOS transistors 71P and 73P, the source is connected to the VDD wire. The input terminal 11 is connected to the gates of the N-channel MOS transistor 71N and the P-channel MOS transistor 71P, and the output terminal 12 is connected to the drains of the N-channel MOS transistor 73N and the P-channel MOS transistor 73P. Between the drains of the N-channel MOS transistor 71N and the P-channel MOS transistor 71P, and the gates of the N-channel MOS transistor 73N and the P-channel MOS transistor 73P, the delay adjusting part 62 is connected.

Figure 26:
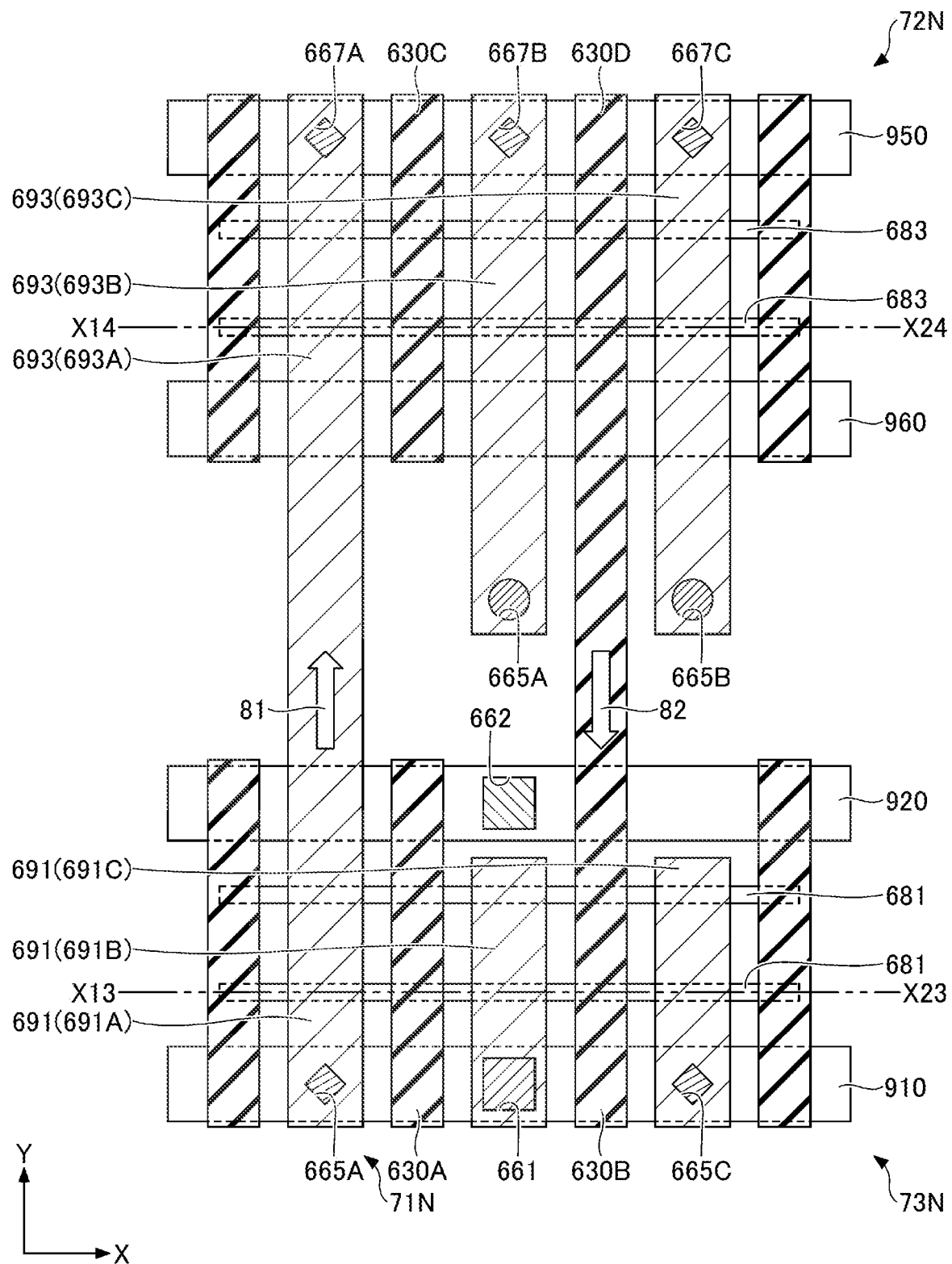
FIG. 26 is a schematic diagram (part 1) illustrating a planar configuration of CFETs and a pseudo CFET in the sixth embodiment.
Figure 27:
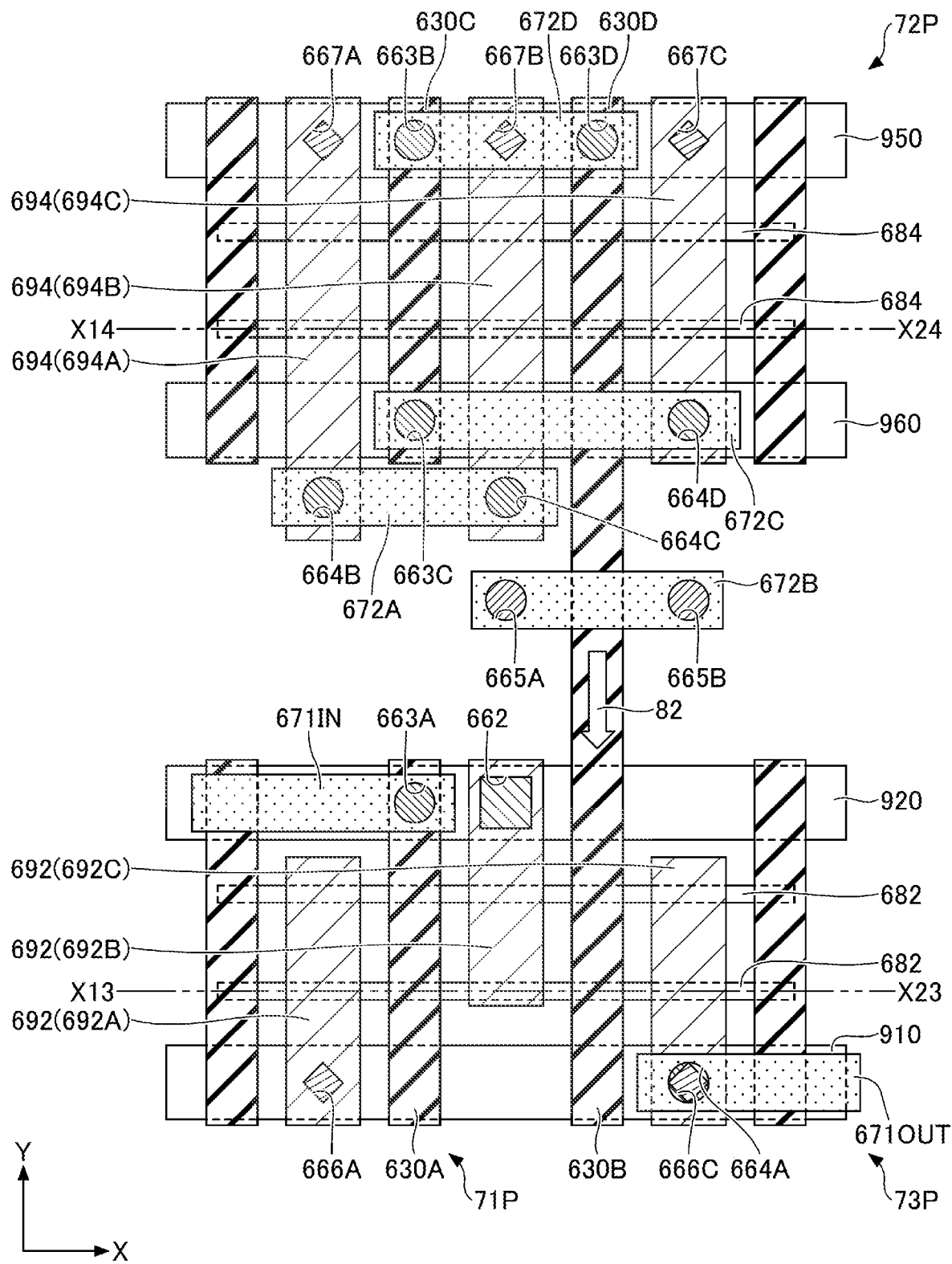
FIG. 27 is a schematic diagram (part 2) illustrating a planar configuration of the CFETs and the pseudo CFET in the sixth embodiment.
Figure 28:
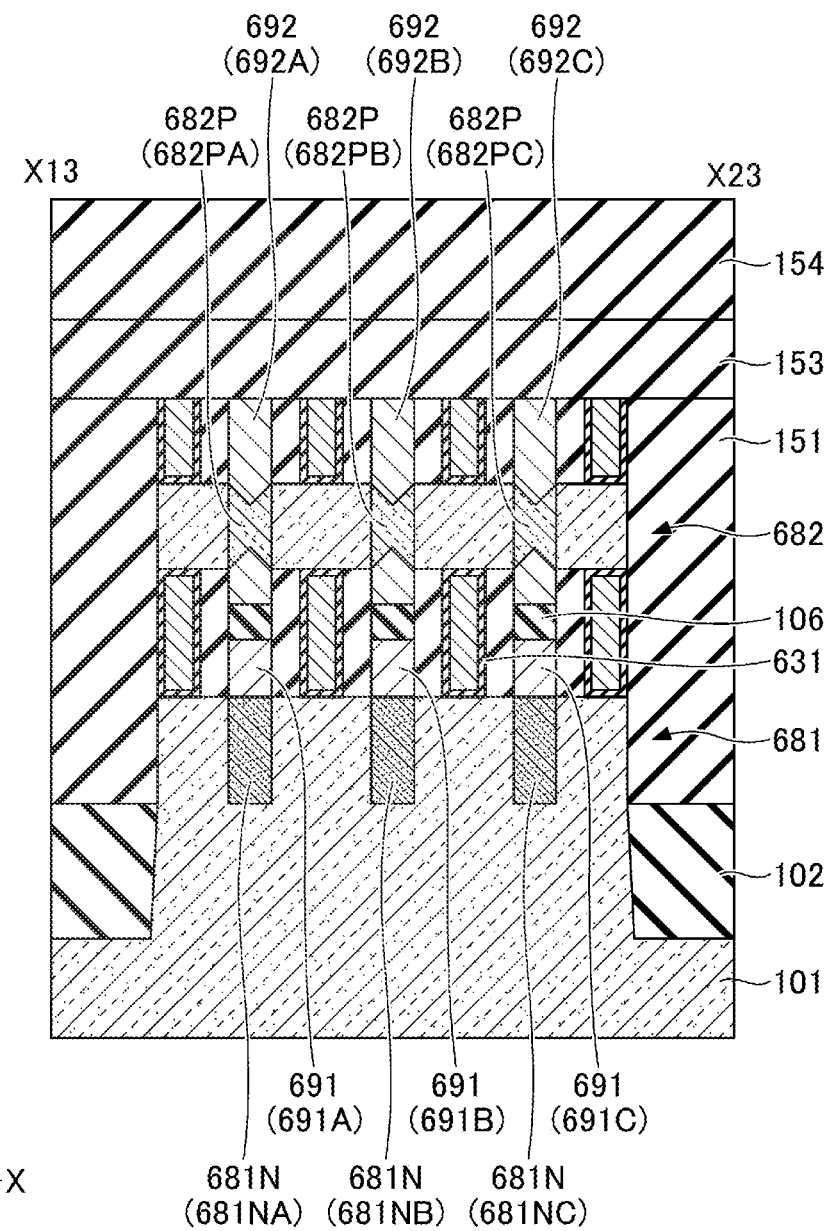
FIG. 28 is a cross sectional view illustrating the CFETs in the sixth embodiment.
Figure 29:
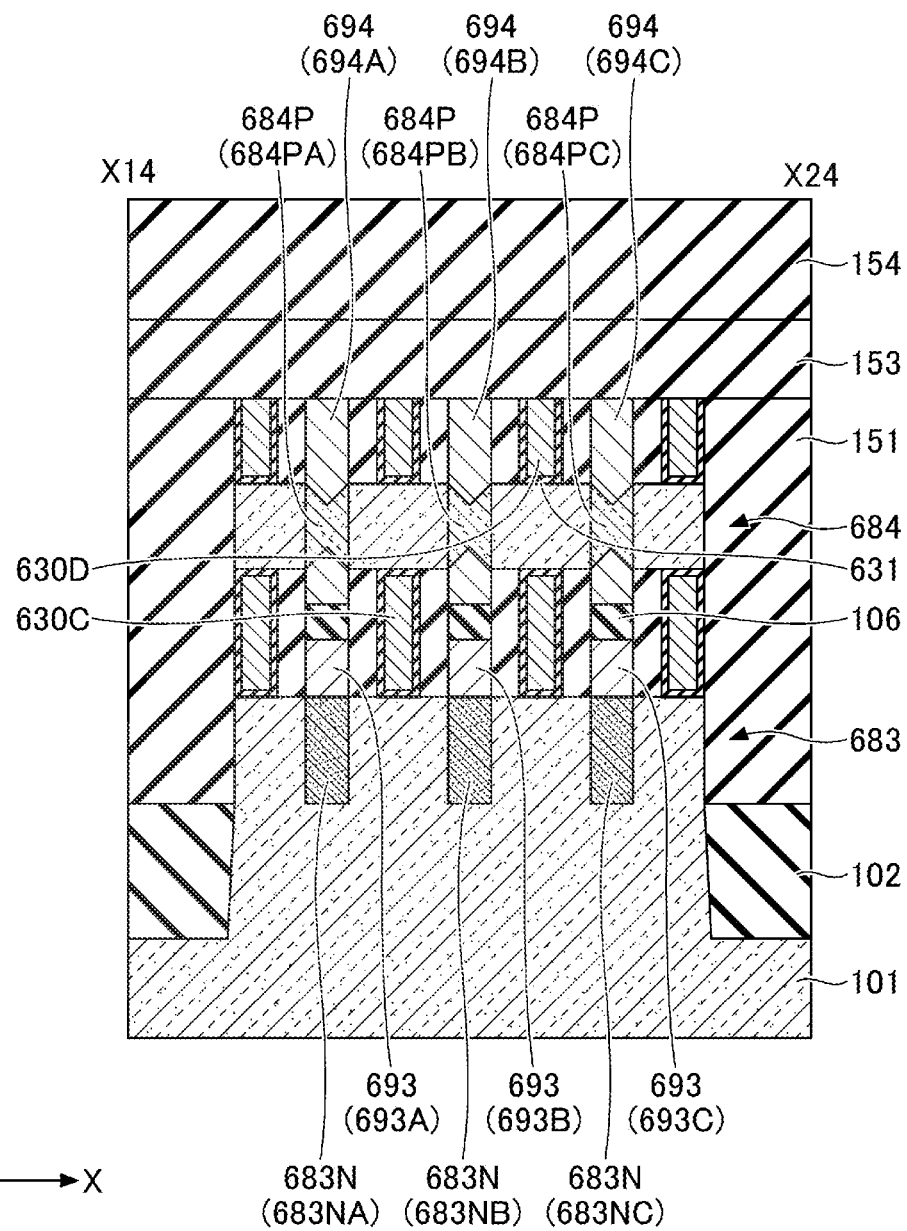
FIG. 29 is a cross sectional view illustrating the pseudo CFET in the sixth embodiment.

Next, a configuration of the CFET 71, the CFET 73, and the pseudo CFET in the sixth embodiment will be described. FIGS. 26 and 27 are schematic diagrams illustrating a planar configuration of the CFET 71, the CFET 73, and the pseudo CFET in the sixth embodiment. FIG. 26 mainly illustrates a layout of the N-channel MOS transistor 71N, the N-channel MOS transistor 73N, and the pseudo N-channel MOS transistor 72N. FIG. 27 mainly illustrates a layout of the P-channel MOS transistor 71P, the P-channel MOS transistor 73P, and the pseudo P-channel MOS transistor 72P. Except for structures illustrated in both FIGS. 26 and 27, the structures illustrated in FIG. 27 are positioned above the structures illustrated in FIG. 26. FIG. 28 is a cross sectional view illustrating the CFET 71 and the CFET 73 in the sixth embodiment. FIG. 29 is a cross sectional view illustrating the pseudo CFET in the sixth embodiment. FIG. 28 corresponds to a cross sectional view along a line X13-X23 in FIGS. 26 and 27. FIG. 29 corresponds to a cross sectional view along a line X14-X24 in FIGS. 26 and 27.

As illustrated in FIGS. 28 and 29, an element separating film 102 is formed over a surface of the substrate 101. Multiple trenches extending in the X direction are formed in the substrate 101 and the element separating film 102. In the CFET 71 and the CFET 73, power lines 910 and 920 are formed in these trenches via the insulating films (not illustrated), and in the pseudo CFET 72, power lines 950 and 960 are formed in these trenches via the insulating films (not illustrated). For example, the power line 910 corresponds to the VSS wire, and the power line 920 corresponds to the VDD wire. The power line 920 is positioned closer to the power lines 950 and 960 than the power line 910 is, and the power line 960 is positioned closer to the power lines 910 and 920 than the power line 950 is.

As illustrated in FIGS. 26 and 28, multiple fins 681 extending in the X direction and rising in the Z direction, are formed to be arranged side by side in the Y direction as semiconductor regions between the power line 910 and the power line 920, over the substrate 101 exposed from the element separating film 102. Here, two fins 681 are provided. Each fin 681 includes multiple N-type regions 681N arranged side by side in the X direction. Here, as the N-type regions 681N, N-type regions 681NA, 681NB, and 681NC are formed side by Across the fins 681, the side in the X direction. N-type regions 681NA are arranged side by side in the Y direction, the N-type regions 681NB are arranged side by side in the Y direction, and the N-type regions 681NC are arranged side by side in the Y direction. The N-type regions 681NA serve as the drain of the N-channel MOS transistor 71N, the N-type regions 681NB serve as the sources of the N-channel MOS transistors 71N and 73N, and the N-type regions 681NC serve as the drain of the N-channel MOS transistor 73N.

As illustrated in FIGS. 26 and 29, multiple fins 683 extending in the X direction and rising in the Z direction, are formed to be arranged side by side in the Y direction as semiconductor regions between the power line 950 and the power line 960, over the substrate 101 exposed from the element separating film 102. Here, two fins 683 are provided. Each fin 683 includes multiple N-type regions 683N arranged side by side in the X direction. Here, as the N-type regions 683N, N-type regions 683NA, 683NB, and 683NC are formed side by side in the X direction. The N-type region 683NA is positioned on an extended line of the N-type region 681NA, the N-type region 683NB is positioned on an extended line of the N-type region 681NB, and the N-type region 683NC is positioned on an extended line of the N-type region 681NC. Across the fins 683, the N-type regions 683NA are arranged side by side in the Y direction, the N-type regions 683NB are arranged side by side in the Y direction, and the N-type regions 683NC are arranged side by side in the Y direction. The N-type regions 683N serve as the source or drain of the pseudo N-channel MOS transistor 72N.

As illustrated in FIGS. 26 and 28, multiple local wires 691 connected to the N-type regions 681N are formed over the element separating film 102. The local wires 691 extend in the Y direction. Here, as the local wires 691, a local wire 691A is formed over the N-type region 681NA, a local wire 691B is formed over the N-type region 681NB, and a local wire 691C is formed over the N-type region 681NC. The local wire 691A extends above the power line 910 and above the power line 920. The local wires 691B and 691C extend above the power line 910.

As illustrated in FIGS. 26 and 29, multiple local wires 693 connected to the N-type regions 683N are formed over the element separating film 102. The local wires 693 extend in the Y direction. Here, as the local wires 693, a local wire 693A is formed over the N-type region 683NA, a local wire 693B is formed over the N-type region 683NB, and a local wire 693C is formed over the N-type region 683NC. The local wire 693A extends above the power line 950 and above the power line 960, and is integrated with the local wire 691A. The local wires 693B and 693C extend above the power line 950 and above the power line 960, and further extend between the power line 960 and the power line 920.

As illustrated in FIG. 26, a contact hole 661 is formed between the local wire 691B and the power line 910. The local wire 691B is connected to the power line 910 via the conductor in the contact hole 661. The local wire 691B electrically connects the power line 910 to the N-type regions 681NB. Over the local wires 691 and 693, an insulating film 106 is formed.

As illustrated in FIGS. 28 and 29, via the insulating films 106, local wires 692 are formed over the local wires 691, and local wires 694 are formed over the local wires 693. Here, as the local wires 692, a local wire 692A is formed over the local wire 691A, a local wire 692B is formed over the local wire 691B, and a local wire 692C is formed over the local wire 691C. Also, as the local wires 692, a local wire 694A is formed over the local wire 693A, a local wire 694B is formed over the local wire 693B, and a local wire 694C is formed over the local wire 693C.

As illustrated in FIG. 27, the local wires 692A and 692C extend above the power line 910. The local wire 692B extend above the power line 920. The local wires 694A and 694B extend above the power line 950 and above the power line 960, and further extend between the power line 960 and the power line 920, although the length is shorter than the local wire 693B. The local wire 694C extends above the power line 950 and above the power line 960.

As illustrated in FIGS. 26 and 27, above the power line 910, between the local wire 691A and the local wire 692A, a contact hole 666A is formed in the insulating film 106. The local wire 691A and the local wire 692A are electrically connected to each other via the conductor in the contact hole 666A. Above the power line 910, between the local wire 691C and the local wire 692C, a contact hole 666C is formed in the insulating film 106. The local wire 691C and the local wire 692C are electrically connected to each other via the conductor in the contact hole 666C. The local wire 691B and the local wire 692B are separated by the respective insulating films 106, to be electrically isolated from each other.

As illustrated in FIGS. 26 and 27, above the power line 950, between the local wire 693A and the local wire 694A, a contact hole 667A is formed in the insulating film 106. The local wire 693A and the local wire 694A are electrically connected to each other via the conductor in the contact hole 667A. Above the power line 950, between the local wire 693B and the local wire 694B, a contact hole 667B is formed in the insulating film 106. The local wire 693B and the local wire 694B are electrically connected to each other via the conductor in the contact hole 667B. Above the power line 950, between the local wire 693C and the local wire 694C, a contact hole 667C is formed in the insulating film 106. The local wire 693C and the local wire 694C are electrically connected to each other via the conductor in the contact hole 667C.

As illustrated in FIGS. 27 and 28, above the fins 681, semiconductor regions 682 extending in the X direction and overlapping the local wires 692 in plan view, are provided. Here, two semiconductor regions 682 are provided. Each semiconductor region 682 includes multiple P-type regions 682P arranged in the X direction and overlapping the N-type regions 681N in plan view. Here, as the P-type regions 682P, a P-type region 682PA is formed above the N-type region 681NA, a P-type region 682PB is formed above the N-type region 681NB, and a P-type region 682PC is formed above the N-type region 681NC. Across the semiconductor regions 682, the P-type regions 682PA are arranged side by side in the Y direction, the P-type regions 682PB are arranged side by side in the Y direction, and the P-type regions 682PC are arranged side by side in the Y direction. Each semiconductor region 682 includes nanowires having corresponding P-type regions 682P interposed. The P-type regions 682PA serve as the drain of the P-channel MOS transistor 71P, the P-type regions 682PB serve as the sources of the P-channel MOS transistors 71P and 73P, and the P-type regions 682PC serve as the drain of the P-channel MOS transistor 73P.

As illustrated in FIGS. 27 and 28, above the fins 683, semiconductor regions 684 extending in the X direction and overlapping the local wires 694 in plan view, are provided.

Here, two semiconductor regions 684 are provided. Each semiconductor region 684 includes multiple P-type regions 684P arranged in the X direction and overlapping the N-type regions 683N in plan view. Here, as the P-type regions 684P, a P-type region 684PA is formed above the N-type region 683NA, a P-type region 684PB is formed above the N-type region 683NB, and a P-type region 684PC is formed above the N-type region 683NC. Across the semiconductor regions 684, the P-type regions 684PA are arranged side by side in the Y direction, the P-type regions 684PB are arranged side by side are the Y direction, and the P-type regions 684PC is arranged side by side in the Y direction. Each semiconductor region 684 includes nanowires having corresponding P-type regions 684P interposed. The P-type regions 684P serve as the source or drain of the pseudo P-channel MOS transistor 72P.

As illustrated in FIGS. 26 to 28, a gate electrode 630A common to the N-channel MOS transistor 71N and the P-channel MOS transistor 71P, and a gate electrode 630B common to the N-channel MOS transistor 73N and the P-channel MOS transistor 73P are formed. The gate electrode 630A is formed between a stacking structure including the local wire 691A and the local wire 692A, and a stacking structure including the local wire 691B and the local wire 692B. The gate electrode 630B is formed between a stacking structure including the local wire 691B and the local wire 692B, and a stacking structure including the local wire 691C and the local wire 692C. The gate electrodes 630A and 630B extend in the Y direction. Gate insulating films 631 are formed between the gate electrodes 630A and 630B and the fins 681, and between the gate electrodes 630A and 630B and the semiconductor regions 682.

As illustrated in FIGS. 26, 27, and 29, a pair of pseudo gate electrodes 630C common to the pseudo N-channel MOS transistor 72N and the pseudo P-channel MOS transistor 72P, and another pair of pseudo gate electrodes 630D common to the pseudo N-channel MOS transistor 72N and the pseudo P-channel MOS transistor 72P are formed. The pseudo gate electrode 630C is formed between a stacking structure including the local wire 693A and the local wire 694A, and a stacking structure including the local wire 693B and the local wire 694B. The pseudo gate electrode 630D is formed between a stacking structure including the local wire 693B and the local wire 694B, and a stacking structure including the local wire 693C and the local wire 694C. The pseudo gate electrodes 630C and 630D extend in the Y direction, and the pseudo gate electrode 630D is integrated with the gate electrode 630B. Gate insulating films 631 are also formed between the pseudo gate electrodes 630C and 630D and the fins 683, and between the pseudo gate electrodes 630C and 630D and the semiconductor regions 684.

As illustrated in FIGS. 28 and 29, an insulating film 151 is formed above the substrate 101 and the element separating film 102. The local wires 691 to 694, the gate electrodes 630A and 630B, and the pseudo gate electrodes 630C and 630D are embedded in the insulating film 151. Also, in plan view, the local wire 692B does not reach an end of the local wire 691B on the power line 910 side, and between the end of the local wire 692B on the power line 910 side and the end of the local wire 691B on the power line 910, an insulating film (not illustrated) is formed over the insulating film 106. In plan view, the local wire 694B does not reach an end of the local wire 693B on the power line 960 side, and between the end of the local wire 694B on the power line 960 side and the end of the local wire 693B on the power line 960, an insulating film (not illustrated) is formed over the insulating film 106. In plan view, the local wire 694C does not reach an end of the local wire 693C on the power line 960 side, and between the end of the local wire 694C on the power line 960 side and the end of the local wire 693C on the power line 960, an insulating film (not illustrated) is formed over the insulating film 106.

An insulating film 153 is formed over the insulating film 151, an insulating film (not illustrated) over the insulating film 106 described above, the local wires 692 and 694, the gate electrodes 630A and 630B, and the pseudo gate electrodes 630C and 630D; and an insulating film 154 is formed over the insulating film 153.

As illustrated in FIGS. 26 and 27, a contact hole 662 reaching the power line 920 is formed between the local wire 692B and the power line 920. The local wire 692B is connected to the power line 920 via the conductor in the contact hole 662. The local wire 692B electrically connects the power line 920 to corresponding P-type regions 682PB.

As illustrated in FIG. 27, in the insulating film 153, a contact hole 663A reaching the gate electrode 630A, contact holes 663B and 663C reaching the pseudo gate electrode 630C, and a contact hole 663D reaching the pseudo gate electrode 630D are formed. The contact hole 663A is formed above the power line 920. The contact hole 663B is formed above the power line 950. The contact hole 663C is formed above the power line 960. The contact hole 663D is formed above the power line 950.

As illustrated in FIG. 27, in the insulating film 153, a contact hole 664A reaching the local wire 692C, a contact hole 664B reaching the local wire 694A, a contact hole 664C reaching the local wire 694B, and a contact hole 664D reaching the local wire 694C are formed. The contact hole 664A reaches an end of the local wire 692C on the power line 910 side. The contact hole 664B reaches an end of the local wire 694A on the power line 960 side. The contact hole 664C reaches an end of the local wire 694B on the power line 960 side. The contact hole 664D reaches an end of the local wire 694C on the power line 960 side.

As illustrated in FIGS. 26 and 27, in the insulating film 153 and the like, a contact hole 665A reaching the local wire 693B, and a contact hole 665B reaching the local wire 693C are formed. The contact hole 665A reaches an end of the local wire 693B on the power line 960 side. The contact hole 665B reaches an end of the local wire 693C on the power line 960 side.

In the insulating film 154, signal lines 671IN and 671OUT, and signal lines 672A, 672B, 672C, and 672D are formed. The signal lines 671IN and 671OUT, and the signal lines 672A, 672B, 672C, and 672D extend in the X direction.

The signal line 671IN is connected to the gate electrode 630A via the conductor in the contact hole 663A. The signal line 671OUT is connected to the local wire 692C via the conductor in the contact hole 664A. The signal line 671IN functions as the input terminal 11, and the signal line 671OUT functions as the output terminal 12.

The signal line 672A is connected to the local wire 694A via the conductor in the contact hole 664B. The signal line 672A is also connected to the local wire 694B via the conductor in the contact hole 664C. The signal line 672B is connected to the local wire 693B via the conductor in the contact hole 665A. The signal line 672B is also connected to the local wire 693C via the conductor in the contact hole 665B. The signal line 672C is connected to the pseudo gate electrode 630C via the conductor in the contact hole 663C. The signal line 672C is also connected to the local wire 694C via the conductor in the contact hole 664D. The signal line 672D is connected to the pseudo gate electrode 630C via the conductor in the contact hole 663B. The signal line 672D is also connected to the pseudo gate electrode 630D via the conductor in the contact hole 663D.

As illustrated in FIGS. 25 to 27, in the sixth embodiment, when the input signal IN is input into the signal line 671IN, an inverted signal 81 is output from the inverter 61 to the local wire 691A. The inverted signal 81 is transferred to the local wire 693A, and via the conductor in the contact hole 667A, transferred to the local wire 694A. The signal is then transferred to the signal line 672A via the conductor in the contact hole 664B, and transferred to the local wire 694B via the conductor in the contact hole 664C. The signal is then transferred to the local wire 693B via the conductor in the contact hole 667B, and transferred to the signal line 672B via the conductor in the contact hole 665A. The signal is then transferred to the local wire 693C via the conductor in the contact hole 665B, and transferred to the local wire 694C via the conductor in the contact hole 667C. The signal is then transferred to the signal line 672C via the conductor in the contact hole 664D, and transferred to the pseudo gate electrode 630C via the conductor in the contact hole 663C. The signal is then transferred to the signal line 672D via the conductor in the contact hole 663B, and transferred to the pseudo gate electrode 630D via the conductor in the contact hole 663D. In this way, the delay adjusting part 62 delays the inverted signal 81. The delayed inverted signal 82 is inverted again by the inverter 63, and the output signal OUT is output from the signal line 671OUT.

Note that two or more pairs of P-channel MOS transistor and N-channel MOS transistor may be included in the inverter 61 or 63.

For example, as the material of the power line formed in the substrate, ruthenium (Ru), cobalt (Co), or tungsten (W) is used. For example, as the material of the power line provided above the fin, copper (Cu), ruthenium (Ru), or cobalt (Co) is used. In the case of using copper or cobalt, it is favorable to form a conductive underfilm (barrier metal film), for example, a tantalum (Ta) film or a tantalum nitride (TaN) film, whereas in the case of using ruthenium, it is not necessary to form an underfilm.

For example, as the material of the local wires, copper (Cu), ruthenium (Ru), cobalt (Co), tungsten (W), or the like is used. In the case of using copper, cobalt, or tungsten, it is favorable to form a conductive underfilm (barrier metal film), for example, a titanium (Ti) film or a titanium nitride (TiN) film, whereas in the case of using ruthenium, it is not necessary to form an underfilm. For example, for the conductors (vias) in the contact holes, for example, substantially the same materials as the materials of the local wires, or substantially the same materials as the materials of wires provided above the fins can be used.

For example, for the substrate, a semiconductor such as silicon (Si) may be used. For example, the fins can be formed by patterning the substrate. A silicide of a high melting point metal such as nickel (Ni) or cobalt (Co) may be provided on part of the fin in contact with the local wire.

For example, for the nanowires, a semiconductor such as silicon (Si) may be used. Also, for the P-type regions between the nanowires, a semiconductor such as Si, silicon carbide (Sic), silicon germanium (SiGe), or the like that is epitaxially grown from the end faces of the nanowires may be used.

For example, for the pseudo gate electrodes and the gate electrodes, a conductive material such as titanium (Ti), titanium nitride (TiN), polysilicon (poly-Si), or the like can be used. For example, for the pseudo gate insulating films and the gate insulating films, a high dielectric material such as hafnium oxide, aluminum oxide, oxide of hafnium and aluminum, or the like may be used.

For example, the power lines provided above the fins are formed by a dual damascene process, together with the contact holes arranged below the power lines. Also, the wires provided above the fins may be formed by a single damascene process, separately from the contact holes arranged below the power lines.

As above, the present inventive concept has been described according to the embodiments; note that the present inventive concept is not limited to the requirements set forth in the embodiments described above. These requirements can be changed within a scope where the gist of the present inventive concept is not impaired, and can be suitably defined according to applications.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   a substrate;
   a first semiconductor region formed over the substrate;
   a second semiconductor region formed over the substrate, and electrically connected to the first semiconductor region;
   a third semiconductor region formed over the substrate, and positioned between the first semiconductor region and the second semiconductor region;
   a fourth semiconductor region formed over the first semiconductor region;
   a fifth semiconductor region formed over the second semiconductor region, and electrically connected to the fourth semiconductor region;
   a sixth semiconductor region formed over the third semiconductor region, and positioned between the fourth semiconductor region and the fifth semiconductor region; and
   wires formed between the first semiconductor region and the second semiconductor region, and between the fourth semiconductor region and the fifth semiconductor region, to cover the third semiconductor region and the sixth semiconductor region, the wires including conductors, wherein
   a part of the wires is located between the substrate and the third semiconductor region.

2. The semiconductor device as claimed in claim 1, wherein the wires extend in a direction perpendicular to a direction in plan view, in which the first semiconductor region and the second semiconductor region are arranged.

3. The semiconductor device as claimed in claim 1, further comprising:
   a first power line to which the first semiconductor region and the second semiconductor region are electrically connected; and
   a second power line to which the fourth semiconductor region and the fifth semiconductor region are electrically connected, wherein the first semiconductor region and the second semiconductor region have a first conductivity type, and wherein the fourth semiconductor region and the fifth semiconductor region have a second conductivity type different from the first conductivity type.

4. The semiconductor device as claimed in claim 3, wherein in a case where a ground potential is supplied to the first power line and a power supply potential higher than the ground potential is supplied to the second power line, the first conductivity type is an N type, and the second conductivity type is a P type, and wherein in a case where a ground potential is supplied to the second power line and a power supply potential higher than the ground potential is supplied to the first power line, the second conductivity type is an N type, and the first conductivity type is a P type.

5. The semiconductor device as claimed in claim 3, wherein in a case where a ground potential is supplied to the first power line and a power supply potential higher than the ground potential is supplied to the second power line, the first conductivity type is a P type, and the second conductivity type is an N type, and wherein in a case where a ground potential is supplied to the second power line and a power supply potential higher than the ground potential is supplied to the first power line, the second conductivity type is a P type, and the first conductivity type is an N type.

6. The semiconductor device as claimed in claim 3, wherein the first power line and the second power line are formed in the substrate.

7. The semiconductor device as claimed in claim 3, further comprising:
a first local wire electrically connecting the first power line and the first semiconductor region;
a second local wire electrically connecting the first power line and the second semiconductor region;
a third local wire electrically connecting the second power line and the fourth semiconductor region; and
a fourth local wire electrically connecting the second power line and the fifth semiconductor region.

8. The semiconductor device as claimed in claim 1, wherein the wires are electrically connected to the first semiconductor region, the second semiconductor region, the fourth semiconductor region, and the fifth semiconductor region.

9. The semiconductor device as claimed in claim 8, further comprising:
a first inverter electrically connected to one end of the wires; and
a second inverter electrically connected to another end of the wire.

10. The semiconductor device as claimed in claim 1, further comprising:

a plurality of basic structures each including the first semiconductor region, the second semiconductor region, the third semiconductor region, the fourth semiconductor region, the fifth semiconductor region, the sixth semiconductor region, and the conductors, wherein the plurality of basic structures are arranged side by side in a direction perpendicular to a direction in which the wires extend in plan view, and wherein the wires are electrically connected in series between adjacent basic structures among the plurality of basic structures.

11. The semiconductor device as claim 1, further comprising:
a first insulating film formed between the substrate and the first semiconductor region; and
a second insulating film formed between the substrate and the second semiconductor region.

12. A semiconductor device comprising:
a substrate;
a first semiconductor region and a second semiconductor region formed over the substrate;
a third semiconductor region formed over the first semiconductor region;
a fourth semiconductor region formed over the second semiconductor region; and
wires formed between the first semiconductor region and the second semiconductor region, and between the third semiconductor region and the fourth semiconductor region, the wires including conductors,
wherein the first semiconductor region, the second semiconductor region, the third semiconductor region, and the fourth semiconductor region are electrically floating;
a first insulating film formed between the substrate and the first semiconductor region; and
a second insulating film formed between the substrate and the second semiconductor region.

13. The semiconductor device as claimed in claim 12, wherein a current flows in the wires in a direction perpendicular to a direction in which the first semiconductor region and the second semiconductor region are arranged.

14. The semiconductor device as claimed in claim 12, further comprising:
a plurality of basic structures each including the first semiconductor region, the second semiconductor region, the third semiconductor region, the fourth semiconductor region, and the conductors,
wherein the plurality of basic structures are arranged side by side in a direction perpendicular to a direction in which the conductors extend, and
wherein the conductors are electrically connected in series between adjacent basic structures among the plurality of basic structures.

* * * * *